US012635305B2

(12) United States Patent
Yang et al.

(10) Patent No.: US 12,635,305 B2
(45) Date of Patent: May 19, 2026

(54) MICRO-DISPLAY UNIT AND DISPLAY PANEL

(71) Applicant: Westlake Smoky Mountains Technologies (Hangzhou) Co., Ltd., Hangzhou (CN)

(72) Inventors: Fan Yang, Hangzhou (CN); Wei Kong, Hangzhou (CN); Junshuai Li, Hangzhou (CN); Haizhong Xie, Hangzhou (CN); Jun Yang, Hangzhou (CN)

(73) Assignee: WESTLAKE SMOKY MOUNTAINS TECHNOLOGIES (HANGZHOU) CO., LTD., Hangzhou (CN)

( * ) Notice: Subject to any disclaimer, the term of this patent is extended or adjusted under 35 U.S.C. 154(b) by 0 days.

(21) Appl. No.: 19/240,350

(22) Filed: Jun. 17, 2025

(65) Prior Publication Data

US 2026/0114087 A1 Apr. 23, 2026

(30) Foreign Application Priority Data

Oct. 18, 2024 (CN) .......................... 202411456629.7

(51) Int. Cl.
*H10H 20/831* (2025.01)
*H10H 29/80* (2025.01)
(52) U.S. Cl.
CPC ..... *H10H 20/8312* (2025.01); *H10H 29/8321* (2025.01)
(58) Field of Classification Search
CPC ....................... H10H 20/8312; H10H 29/8321
See application file for complete search history.

(56) References Cited

U.S. PATENT DOCUMENTS

2007/0284602 A1* 12/2007 Chitnis .............. H10H 20/8312
438/455
2014/0252382 A1* 9/2014 Hashimoto ........ H10H 20/8312
438/27
2021/0367105 A1 11/2021 Wang et al.

FOREIGN PATENT DOCUMENTS

CN 208127232 A 11/2018
CN 112968086 A 6/2021
CN 115020551 A 9/2022
CN 116666503 A 8/2023
CN 117438516 A 1/2024

OTHER PUBLICATIONS

Chinese Office Action 202411456629.7, Issued Nov. 28, 2024.

* cited by examiner

*Primary Examiner* — Su C Kim
(74) *Attorney, Agent, or Firm* — The Belles Group, P.C.

(57) ABSTRACT

Provided are a micro-display unit and a display panel. A first epitaxial structure and a second epitaxial structure of the micro-display unit are stacked; and a light-emitting element formed by the first epitaxial structure and a light-emitting element formed by the second epitaxial structure are connected in series. A first conductive contact portion is located on one side of the first epitaxial structure, and when the first epitaxial structure and the second epitaxial structure are aligned and bonded, the first epitaxial structure and the second epitaxial structure are directly bonded through a bonding layer, then a first via hole is formed at the position corresponding to a first conductive contact portion, and a second via hole corresponding to a connection electrode is formed in the second epitaxial structure.

20 Claims, 15 Drawing Sheets

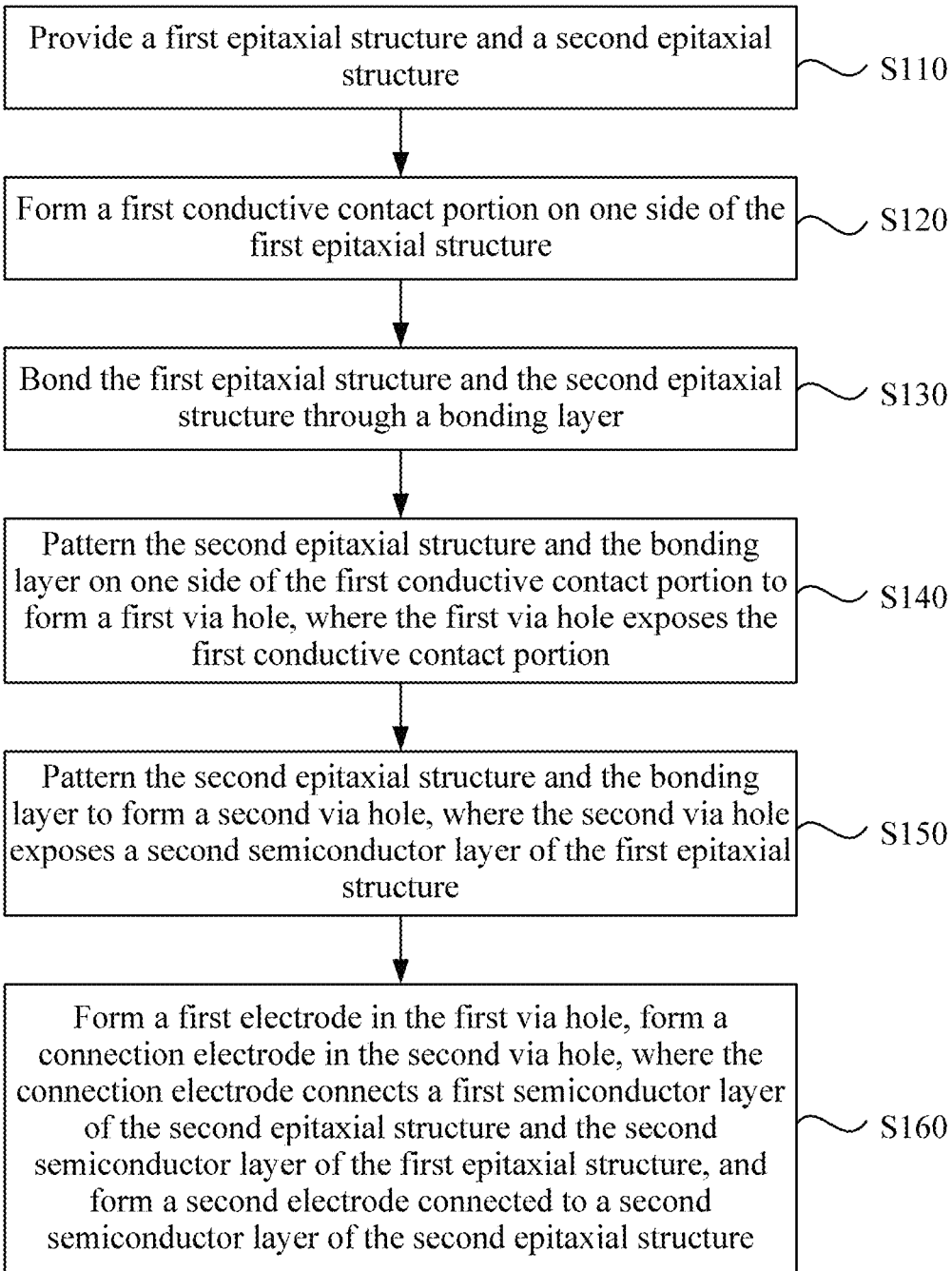

Provide a first epitaxial structure and a second epitaxial structure ~S110

Form a first conductive contact portion on one side of the first epitaxial structure ~S120

Bond the first epitaxial structure and the second epitaxial structure through a bonding layer ~S130

Pattern the second epitaxial structure and the bonding layer on one side of the first conductive contact portion to form a first via hole, where the first via hole exposes the first conductive contact portion ~S140

Pattern the second epitaxial structure and the bonding layer to form a second via hole, where the second via hole exposes a second semiconductor layer of the first epitaxial structure ~S150

Form a first electrode in the first via hole, form a connection electrode in the second via hole, where the connection electrode connects a first semiconductor layer of the second epitaxial structure and the second semiconductor layer of the first epitaxial structure, and form a second electrode connected to a second semiconductor layer of the second epitaxial structure ~S160

FIG. 8

MICRO-DISPLAY UNIT AND DISPLAY PANEL

CROSS-REFERENCE TO RELATED APPLICATION

This application claims priority to Chinese patent application No. 202411456629.7 filed with the China National Intellectual Property Administration (CNIPA) on Oct. 18, 2024, the disclosure of which is incorporated herein by reference in its entirety.

TECHNICAL FIELD

The present disclosure relates to the field of display technology, particularly a micro-display unit and a display panel.

BACKGROUND

Micro light-emitting diode (micro-LED) chips are widely used in display devices due to their characteristics such as small size, high integration, and self-emission.

The luminous efficiency of a micro-LED chip is related to the current density. In the related art, a micro-LED chip has a small current density and a low luminous efficiency.

BRIEF SUMMARY

The present disclosure provides a micro-display unit and a display panel to improve the luminous efficiency of a micro-LED chip.

The present disclosure provides a micro-display unit. The micro-display unit includes a first epitaxial structure, a second epitaxial structure, and a bonding layer. The first epitaxial structure and the second epitaxial structure are stacked along the thickness direction of the micro-display unit. The bonding layer is located between the first epitaxial structure and the second epitaxial structure.

The first epitaxial structure and the second epitaxial structure each include an epitaxial layer. The epitaxial layer includes a first semiconductor layer, a light-emitting layer, and a second semiconductor layer that are stacked. In each of the first epitaxial structure and the second epitaxial structure, the first semiconductor layer is located on the side of the second semiconductor layer facing the bonding layer.

The micro-display unit also includes a first conductive contact portion. The first conductive contact portion is located on the side of the first epitaxial structure facing the bonding layer. The second epitaxial structure is provided with a first via hole at a position corresponding to the first conductive contact portion.

The micro-display unit also includes a first electrode, a connection electrode, and a second electrode. The first electrode passes through the first via hole and is electrically connected to the first conductive contact portion. The second electrode is electrically connected to the second semiconductor layer of the second epitaxial structure.

The second epitaxial structure is further provided with a second via hole. The second via hole penetrates the second epitaxial structure and extends to the second semiconductor layer of the first epitaxial structure. The connection electrode passes through the second via hole and is electrically connected to the second semiconductor layer of the first epitaxial structure. The connection electrode is further electrically connected to the first semiconductor layer of the second epitaxial structure.

The present disclosure further provides a manufacturing method of a micro-display unit. The manufacturing method of the micro-display unit includes providing a first epitaxial structure and a second epitaxial structure; forming a first conductive contact portion on one side of the first epitaxial structure, where the first conductive contact portion is connected to a first semiconductor layer of the first epitaxial structure; bonding the first epitaxial structure and the second epitaxial structure through a bonding layer; patterning the second epitaxial structure and the bonding layer on one side of the first conductive contact portion to form a first via hole, where the first via hole exposes the first conductive contact portion; patterning the second epitaxial structure and the bonding layer to form a second via hole, where the second via hole exposes a second semiconductor layer of the first epitaxial structure; and forming a first electrode in the first via hole, forming a connection electrode in the second via hole, where the connection electrode connects a first semiconductor layer of the second epitaxial structure and the second semiconductor layer of the first epitaxial structure, and forming a second electrode connected to a second semiconductor layer of the second epitaxial structure.

The present disclosure further provides a display panel. The display panel includes the micro-display unit of any embodiment of the present disclosure.

In solutions of embodiments of the present disclosure, the first epitaxial structure and the second epitaxial structure of the micro-display unit are stacked, reducing the planar area occupied by the micro-display unit and the size of the micro-display unit. The light-emitting element formed by the first epitaxial structure and the light-emitting element formed by the second epitaxial structure are connected in series, increasing the current density of the micro-display unit and improving the luminous efficiency of the micro-display unit. Moreover, in solutions of the present disclosure, the first conductive contact portion is located on one side of the first epitaxial structure, and when the first epitaxial structure and the second epitaxial structure are aligned and bonded, the first epitaxial structure and the second epitaxial structure are directly bonded through the bonding layer, then the first via hole is formed at the position corresponding to the first conductive contact portion, and the second via hole corresponding to the connection electrode is formed in the second epitaxial structure, thereby reducing the requirements for the bonding process.

It is to be understood that the content described in this part is neither intended to identify key or important features of embodiments of the present disclosure nor intended to limit the scope of the present disclosure. Other features of the present disclosure are apparent from the description provided hereinafter.

BRIEF DESCRIPTION OF DRAWINGS

To illustrate solutions of embodiments of the present disclosure more clearly, drawings used in description of embodiments of the present disclosure are described hereinafter. Apparently, these drawings illustrate part of embodiments of the present disclosure. Those of ordinary skill in the art may obtain other drawings based on these drawings on the premise that no creative work is done.

FIG. 8 is a flowchart of a manufacturing method of a micro-display unit according to an embodiment of the present disclosure.

DETAILED DESCRIPTION

For a better understanding of solutions of the present disclosure by those skilled in the art, solutions in embodiments of the present disclosure are described clearly and completely hereinafter in conjunction with the drawings in embodiments of the present disclosure. Apparently, the embodiments described hereinafter are part, not all, of embodiments of the present disclosure. Based on embodiments of the present disclosure, all other embodiments obtained by those of ordinary skill in the art on the premise that no creative work is done are within the scope of the present disclosure.

It is to be noted that the terms such as "first" and "second" in the description, claims and drawings of the present disclosure are used to distinguish between similar objects and are not necessarily used to describe a particular order or sequence. It is to be understood that the data used in this way is interchangeable where appropriate so that embodiments of the present disclosure described herein may also be implemented in a sequence not illustrated or described herein. In addition, the terms "comprising", "including" and any other variations thereof are intended to encompass a non-exclusive inclusion. For example, a process, method, system, product or device that includes a series of steps or units not only includes the expressly listed steps or units but may also include other steps or units that are not expressly listed or are inherent to such process, method, product or device.

As described in the background, in the related art, a micro-LED chip has a small current density and a low luminous efficiency. In the related art, two micro-LEDs are connected in series to form a micro-LED chip to increase the current density and thus improve the luminous efficiency. However, the micro-LED chip formed by two micro-LEDs connected in series is too large in size, affecting the resolution of the display panel.

Figure 1:
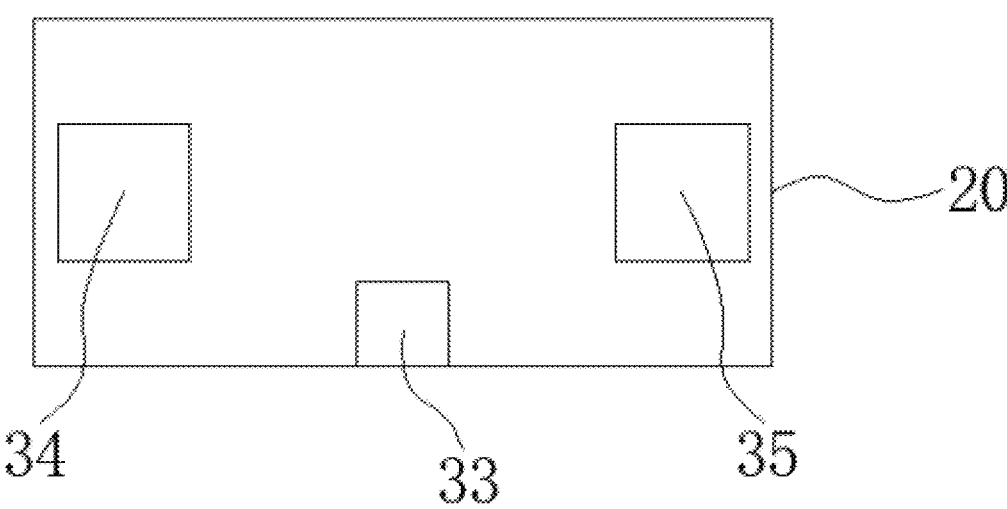
FIG. 1 is a top view of a micro-display unit according to an embodiment of the present disclosure.
Figure 2:
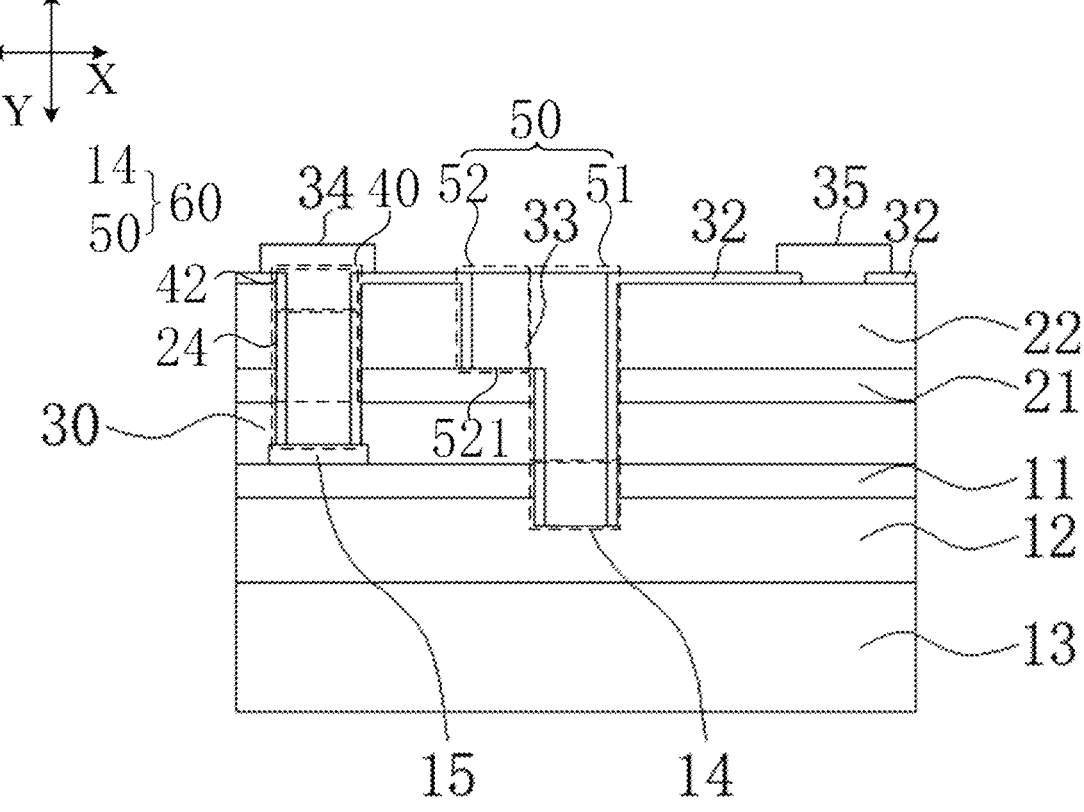
FIG. 2 is a section view of a micro-display unit according to an embodiment of the present disclosure.
Figures 30, 31, 32:
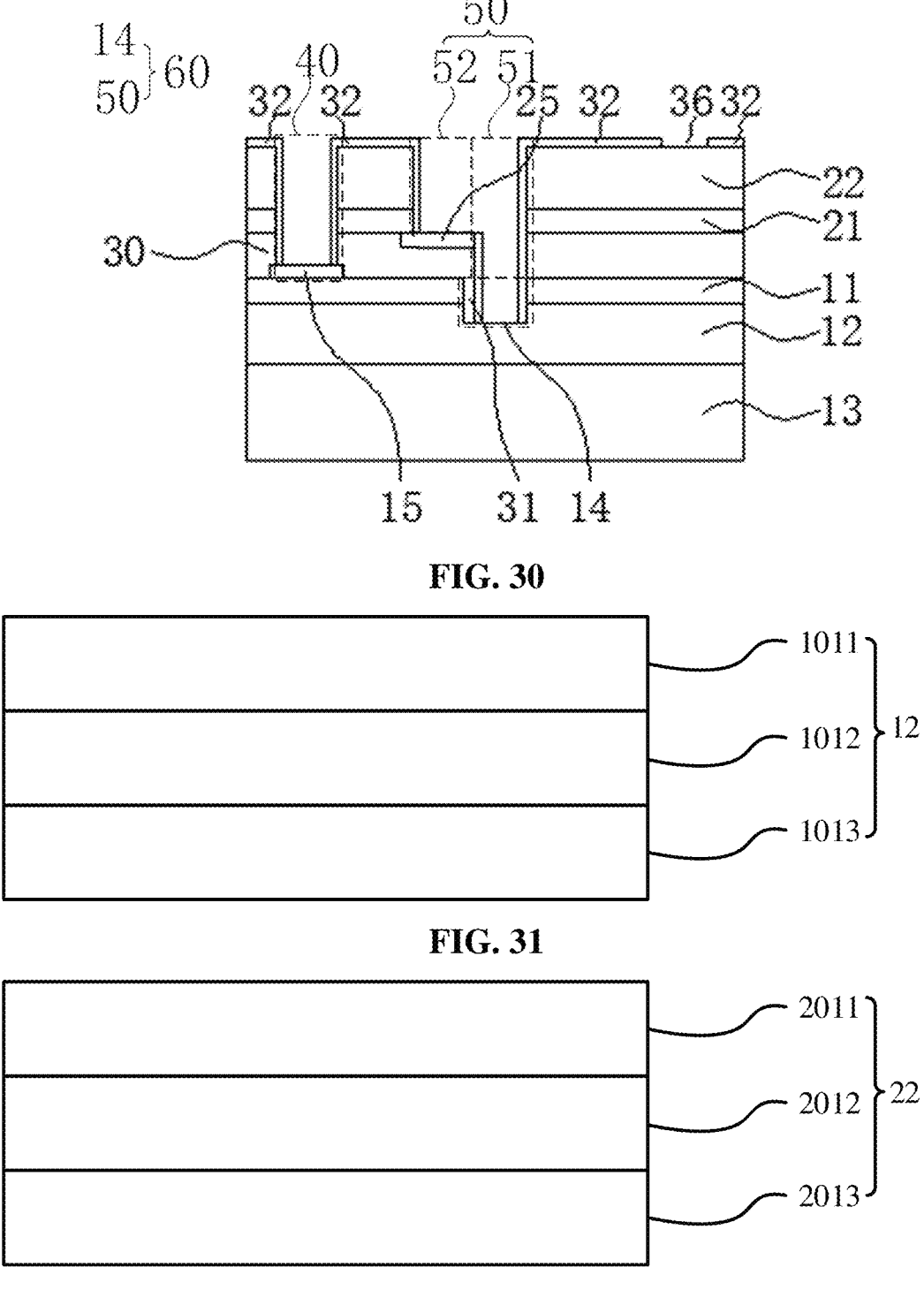
FIG. 30 is a view of a structure provided with an opening area.
FIG. 31 is a view illustrating the structure of a first epitaxial layer.
FIG. 32 is a view illustrating the structure of a second epitaxial layer.

An embodiment of the present disclosure provides a micro-display unit. FIG. 1 is a top view of a micro-display unit according to an embodiment of the present disclosure. FIG. 2 is a section view of a micro-display unit according to an embodiment of the present disclosure. FIG. 31 is a view illustrating the structure of a first epitaxial layer. FIG. 32 is a view illustrating the structure of a second epitaxial layer. Referring to FIG. 1, FIG. 2, FIG. 31 and FIG. 32, the micro-display unit includes a first epitaxial structure 10, a second epitaxial structure 20, and a bonding layer 30. The first epitaxial structure 10 and the second epitaxial structure 20 are stacked along the thickness direction y of the micro-display unit. The bonding layer 30 is located between the first epitaxial structure 10 and the second epitaxial structure 20. The first epitaxial structure 10 and the second epitaxial structure 20 each include an epitaxial layer. The epitaxial layer includes a first semiconductor layer, a light-emitting layer, and a second semiconductor layer that are stacked. In each of the first epitaxial structure 10 and the second epitaxial structure 20, the first semiconductor layer is located on the side of the second semiconductor layer facing the bonding layer 30. The micro-display unit also includes a first conductive contact portion 15. The first conductive contact portion 15 is located on the side of the first epitaxial structure 10 facing the bonding layer 30. The second epitaxial structure 20 is provided with a first via hole 40 at a position corresponding to the first conductive contact portion 15. The micro-display unit also includes a first electrode 34, a connection electrode 33, and a second electrode 35. The first electrode 34 passes through the first via hole 40 and is electrically connected to the first conductive contact portion 15. The second electrode 35 is electrically connected to the second semiconductor layer 2013 of the second epitaxial structure 20. The second epitaxial structure 20 is also provided with a second via hole 60. The second via hole 60 penetrates the second epitaxial structure 20 and extends to the second semiconductor layer 1013 of the first epitaxial structure 10. The connection electrode 33 passes through the second via hole 60 and is electrically connected to the second semiconductor layer 1013 of the first epitaxial structure 10. The connection electrode 33 is also electrically connected to the first semiconductor layer 2011 of the second epitaxial structure 20.

The first epitaxial structure 10 and the second epitaxial structure 20 are two epitaxial structures stacked along the thickness direction Y of the micro-display unit. Any one of the two stacked epitaxial structures may be used as the first epitaxial structure 10, and the other one of the two stacked epitaxial structures may be used as the second epitaxial structure 20. The first epitaxial structure 10 includes a first epitaxial layer 12. The first epitaxial layer 12 is located on one side of a first substrate 13. The second epitaxial structure 20 includes a second epitaxial layer 22. The first epitaxial layer 12 and the second epitaxial layer 22 each include a first semiconductor layer, a light-emitting layer, and a second semiconductor layer that are stacked. The first semiconductor layer is an N-type semiconductor layer, and the second semiconductor layer is a P-type semiconductor layer; or the first semiconductor layer is a P-type semiconductor layer, and the second semiconductor layer is an N-type semiconductor layer. The N-type semiconductor layer may include n-GaN. The P-type semiconductor layer may include p-GaN. The light-emitting layer may be a quantum well layer. In one or more embodiments, the light-emitting layer may be a multi-quantum well layer, for example, an InGaN/GaN multi-quantum well layer. The first epitaxial structure 10 and the second epitaxial structure 20 are stacked along the thickness direction Y of the micro-display unit. The bonding layer 30 is located between the first epitaxial structure 10 and the second epitaxial structure 20 to connect the first epitaxial structure 10 and the second epitaxial structure 20.

The micro-display unit also includes a first conductive contact portion 15. The first conductive contact portion 15 is located on the side of the first epitaxial structure 10 facing the bonding layer 30. The first conductive contact portion 15 is directly or indirectly electrically connected to the first semiconductor layer 1011 of the first epitaxial structure 10. The first conductive contact portion 15 may be made of a metal material. The second epitaxial structure 20 includes a first via 40 at a position corresponding to the first conductive contact portion. The first electrode 34 may be partially located in the first via 40 and electrically connected to the first conductive contact portion 15 so that the first electrode 34 is electrically connected to the first semiconductor layer 1011 of the first epitaxial structure 10. In the manufacturing process of the micro-display unit, in the process of forming the first via hole 40 by patterning, the first conductive contact portion 15 may be used as an etch stop layer to reduce the risk of over-etching the first epitaxial structure 10 when the first via hole 40 is formed. The first conductive contact portion 15 also has a reflection function so that the light reaching the first conductive contact portion 15 can be reflected out, thereby increasing the amount of light emitted from the micro-display unit. In some embodiments, the second electrode 35 may be located on the side of the second epitaxial structure 20 facing away from the first epitaxial structure 10, thereby facilitating the electrical connection between the second electrode 35 and the second semiconductor layer 2013 of the second epitaxial structure 20.

The second epitaxial structure 20 is also provided with a second via hole 60. The second via hole 60 penetrates the second epitaxial structure 20 and extends to the second semiconductor layer 1013 of the first epitaxial structure 10.

The connection electrode 33 passes through the second via hole 60 and is electrically connected to the second semiconductor layer 1013 of the first epitaxial structure 10. The connection electrode 33 is also electrically connected to the first semiconductor layer 2011 of the second epitaxial structure 20. Thus, a light-emitting element formed by the first epitaxial structure 10 and a light-emitting element formed by the second epitaxial structure 20 are connected in series, increasing the current density of the micro-display unit and improving the luminous efficiency of the micro-display unit. Moreover, the first epitaxial structure 10 and the second epitaxial structure 20 of the micro-display unit are stacked, reducing the planar area occupied by the micro-display unit and the size of the micro-display unit. That is, the micro-display unit of the embodiment of the present disclosure can have a higher current density and a higher luminous efficiency while having a small size and ensuring a high resolution of the display panel. In the micro-display unit of the embodiment of the present disclosure, the first conductive contact portion 15 is located on one side of the first epitaxial structure 10, and when the first epitaxial structure 10 and the second epitaxial structure 20 are aligned and bonded, the first epitaxial structure 10 and the second epitaxial structure 20 are directly bonded through the bonding layer 30, then the first via hole 40 is formed at the position corresponding to the first conductive contact portion 15, and the second via hole 60 corresponding to the connection electrode 33 is formed in the second epitaxial structure 20, thereby reducing the requirements for the bonding process.

With continued reference to FIG. 1 and FIG. 2, in one or more embodiments, the second via hole 60 includes a first etched groove 14 and a first connection hole 50. The first etched groove 14 extends from the surface of the first epitaxial structure 10 facing the bonding layer 30 to the second semiconductor layer 1013 of the first epitaxial structure 10. The first connection hole 50 is located on the side of the first etched groove 14 facing away from the first epitaxial structure 10. The first connection hole 50 penetrates the second epitaxial structure 20 and the bonding layer 30 and communicates with the first etched groove 14. The first connection hole 50 is formed after the first etched groove 14.

Before the first epitaxial structure 10 and the second epitaxial structure 20 are bonded, a first etched groove 14 may be formed in the first epitaxial structure 10. The first etched groove 14 extends from the first semiconductor layer 1011 of the first epitaxial structure 10 to the second semiconductor layer. The first connection hole 50 may be formed after the first epitaxial structure 10 and the second epitaxial structure 20 are bonded. In one or more embodiments, when the second via hole 60 is formed, a first connection hole 50 with partial deep is formed, with one of the layers in the second epitaxial structure 20 or a newly added etch stop structure in the micro-display unit as the etch stop layer; and then the bonding layer 30 is etched to form the second via hole 60. Because the first epitaxial structure 10 includes the first etched groove 14, when the first epitaxial structure 10 and the second epitaxial structure 20 are bonded by using the bonding layer 30, the bonding material is filled in the first etched groove 14 so that the bonding material at the position of the first etched groove 14 is thick. The thick bonding layer can form a buffer, being more conducive to precise control of etching, expanding the etching process window, and reducing the risk of over-etching the first epitaxial structure 10. Moreover, in such a micro-display unit structure, when the first epitaxial structure 10 and the second epitaxial structure 20 are bonded, the first epitaxial structure 10 and the second epitaxial structure 20 are not required to be precisely aligned, thereby simplifying the bonding process and improving the bonding yield.

With continued reference to FIG. 1 and FIG. 2, in one or more embodiments, the first connection hole 50 includes a first hole portion 51 and a second hole portion 52. The second hole portion 52 is located on at least one side of the first hole portion 51 in the horizontal direction X. The horizontal direction X is perpendicular to the thickness direction Y of the micro-display unit. The first hole portion 51 penetrates the second epitaxial structure 20 and the bonding layer 30 and communicates with the first etched groove 14. The second hole portion 52 penetrates the epitaxial layer of the second epitaxial structure 20. That is, the second hole portion 52 penetrates the second semiconductor layer 2013, the light-emitting layer 2012, and the first semiconductor layer 2011 of the second epitaxial structure 20. The bottom surface of the second hole portion 52 and the side surface of the first hole portion 51 are connected to form a step structure. The bottom surface of the second hole portion 52 serves as the mesa 521 of the step structure. The connection electrode 33 is electrically connected to the first semiconductor layer 2011 of the second epitaxial structure 20 at the mesa 521. The connection electrode 33 is electrically connected to the second semiconductor layer 1013 of the first epitaxial structure 10 at the bottom of the first etched groove 14.

In the first connection hole 50, the depth of the first hole portion 51 is greater than the depth of the second hole portion 52 so that the first connection hole 50 forms a step structure. The bottom surface of the second hole portion 52 may form the mesa 521 of the step structure. The connection electrode 33 is electrically connected to the first semiconductor layer 2011 of the second epitaxial structure 20 at the mesa 521. The connection electrode 33 is electrically connected to the second semiconductor layer 1013 of the first epitaxial structure 10 at the bottom of the first etched groove 14. Thus, the light-emitting element formed by the first epitaxial structure 10 and the light-emitting element formed by the second epitaxial structure 20 are connected in series, improving the luminous efficiency of the micro-display unit.

In one or more embodiments, the first epitaxial structure 10 also includes a first current spreading layer 11. The first current spreading layer 11 is located between the first semiconductor layer 1011 of the first epitaxial structure 10 and the bonding layer 30. The second epitaxial structure 20 also includes a second current spreading layer 21. The second current spreading layer 21 is located between the first semiconductor layer 2011 of the second epitaxial structure 20 and the bonding layer 30.

The first current spreading layer 11 and the second current spreading layer 21 are conductive transparent structures. The light transmittance of each of the two layers is greater than 90%. In one or more embodiments, the first current spreading layer 11 and the second current spreading layer 21 may each be made of a metal oxide, for example, an indium tin oxide.

In some embodiments of the present disclosure, the second hole portion 52 extends to the second current spreading layer 21, and the mesa 521 is formed on the position that is located on the surface of the second current spreading layer 21 facing away from the bonding layer 30 and corresponds to the second hole portion 52. At the mesa 521, the connection electrode 33 is in contact with the second current spreading layer 21, and the connection electrode 33 may be electrically connected to the first semiconductor layer 2011 of the second epitaxial structure 20 through the second current spreading layer 21. For such a micro-display unit structure, when the second via hole 60 is prepared, a set region on one side of the first etched groove 14 is patterned to the second current spreading layer 21 to form a first groove. The first groove penetrates the second semiconductor layer 2013, the light-emitting layer 2012, and the first semiconductor layer 2011 of the second epitaxial structure 20. The first groove exposes the second current spreading layer 21. That is, the second current spreading layer 21 serves as the etch stop layer to form the first groove. The area of the first groove is greater than the area of the first etched groove 14. The orthographic projection of the first groove on the first epitaxial structure 10 covers the orthographic projection of the first etched groove 14 on the first epitaxial structure 10. Then, the bonding layer 30 and the second current spreading layer 21 located at the bottom of the first groove and corresponding to at least part of the first etched groove 14 are etched to expose at least part of the bottom of the first etched groove 14. Thus, the second hole portion 52 may be formed at the position where the orthographic projection of the first groove and the orthographic projection of the first etched groove 14 do not overlap along the thickness direction Y of the micro-display unit, and the first hole portion 51 may be formed at the position where the orthographic projection of the first groove and the orthographic projection of the first etched groove 14 overlap along the thickness direction Y of the micro-display unit to communicate with the first etched groove 14.

Figure 3:
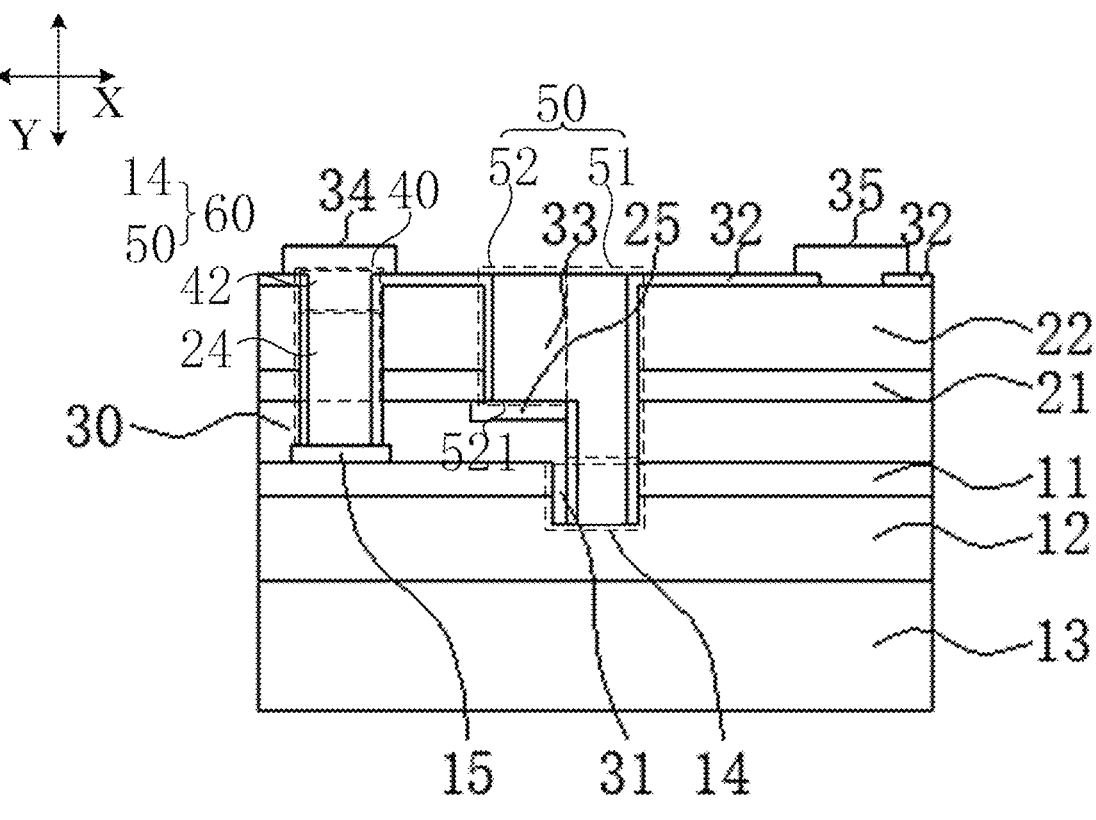
FIG. 3 is a section view of a micro-display unit according to an embodiment of the present disclosure.

FIG. 3 is a section view of a micro-display unit according to an embodiment of the present disclosure. Referring to FIG. 3, in one or more embodiments, the micro-display unit also includes a second conductive contact portion 25. The second conductive contact portion 25 is located on the side of the second epitaxial structure 20 facing the bonding layer 30. The mesa 521 is formed at the position that is located on the surface of the second conductive contact portion 25 facing away from the bonding layer 30 and corresponds to the second via hole 30. The second conductive contact portion 25 is electrically connected to the first semiconductor layer 2011 of the second epitaxial structure 20 and the connection electrode 33.

In the case where the second epitaxial structure 20 includes the second current spreading layer 21, the second conductive contact portion 25 may be located on the side of the second current spreading layer 21 facing away from the first semiconductor layer 2011 of the second epitaxial structure 20, and the second conductive contact portion 25 is connected to the first semiconductor layer 2011 of the second epitaxial structure 20 through the second current spreading layer 21. In an example, at the position of the mesa 521, part of the second current spreading layer 21 of the second epitaxial structure 20 may be retained on the surface of the second conductive contact portion 25 facing away from the bonding layer 30 to ensure that the second conductive contact portion 25 can be in contact with the second current spreading layer 21 so that the connection electrode 23 can be electrically connected to the first semiconductor layer 2011 of the second epitaxial structure 20 through the second conductive contact portion 25 and the second current spreading layer 21. In the case where the second epitaxial structure 20 does not include the second current spreading layer 21, the second conductive contact portion 25 may be located on the side of the first semiconductor layer 2011 of the second epitaxial structure 20 facing away from the second semiconductor layer and in contact with the first semiconductor layer 2011 of the second epitaxial structure 20. Specifically, at the position of the mesa 521, part of the first semiconductor layer 2011 of the second epitaxial structure 20 may be retained on the surface of the second conductive contact portion 25 facing away from the bonding layer 30 to ensure that the second conductive contact portion 25 can be in contact with the first semiconductor layer 2011 of the second epitaxial structure 20 so that the connection electrode 33 can be electrically connected to the first semiconductor layer 2011 of the second epitaxial structure 20 through the second conductive contact portion 25. The second conductive contact portion 25 may be made of a metal material. When the second via hole 60 is formed, first the second epitaxial structure 20 may be patterned, and a second groove penetrating the second semiconductor layer 2013, the light-emitting layer 2012, and the first semiconductor layer 2011 of the second epitaxial structure 20 is formed, with the second conductive contact portion 25 being used as the etch stop layer. The second groove may expose part of the second conductive contact portion 25 and part of the bonding layer 30. Then the bonding layer 30 at the position of the first etched groove 14 is etched so that the bottom of the first etched groove 14 is exposed. Thus, the second via hole 60 is formed. After the connection electrode 33 is formed in the second via hole 60, the connection electrode 33 is in contact with the second conductive contact 25 at the mesa 521, and the connection electrode 33 is in contact with the second semiconductor layer 1013 of the first epitaxial structure 10 at the bottom of the first etched groove 14.

Figure 4:
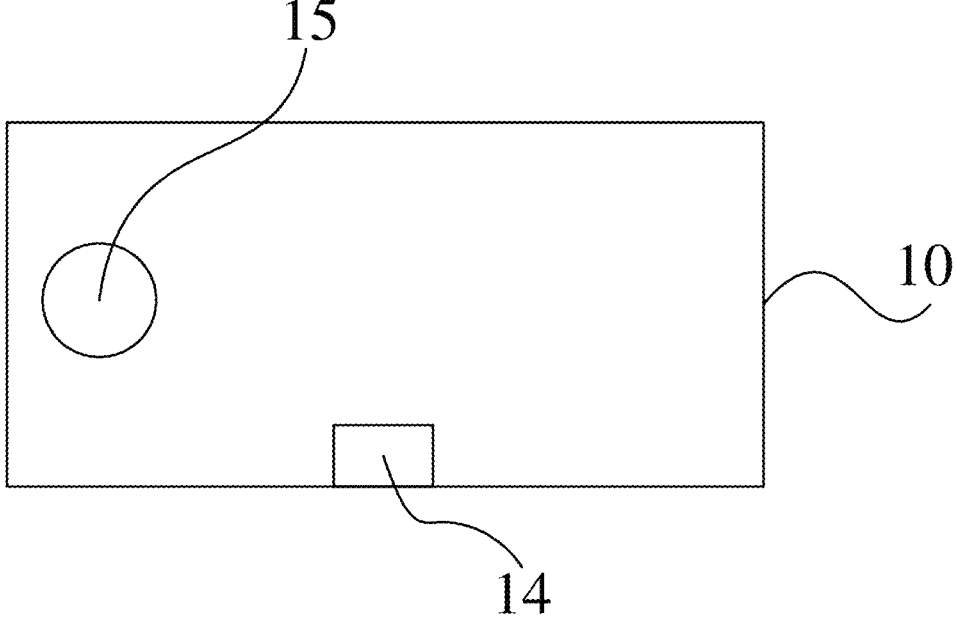
FIG. 4 is a top view of a first epitaxial structure.
Figure 5:
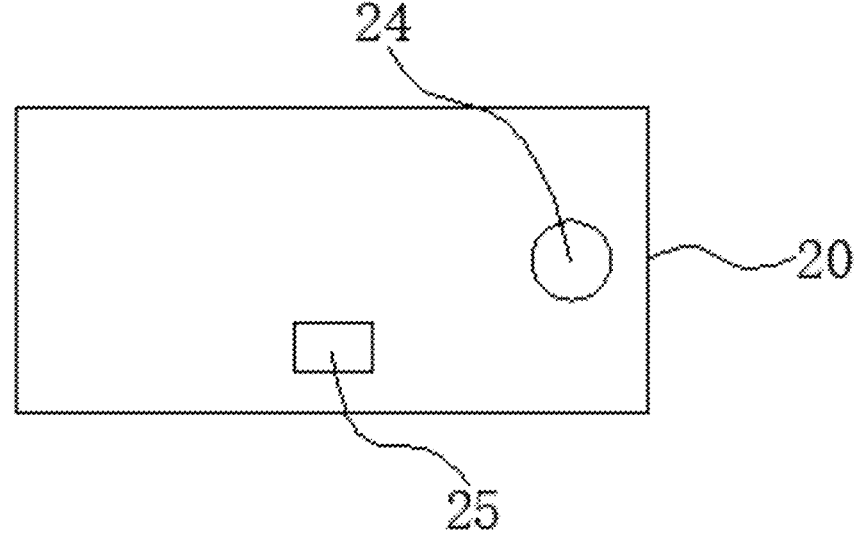
FIG. 5 is a top view of a second epitaxial structure.
Figure 6:
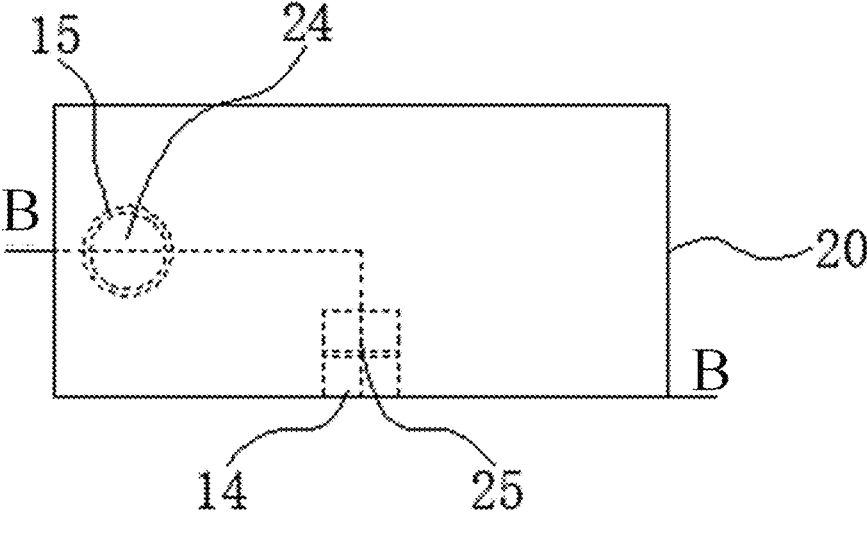
FIG. 6 is a top view of a structure in which the first epitaxial structure of FIG. 4 and the second epitaxial structure of FIG. 5 are bonded.

FIG. 4 is a top view of a first epitaxial structure. FIG. 5 is a top view of a second epitaxial structure. FIG. 6 is a top view of a structure in which the first epitaxial structure of FIG. 4 and the second epitaxial structure of FIG. 5 are bonded. Referring to FIG. 2 to FIG. 6, in one or more embodiments, the orthographic projection of the second conductive contact portion 25 on the first epitaxial structure 10 is partially located at the edge of the bottom of the first etched groove 14, the bonding layer 30 extends from the side of the second conductive contact portion 25 facing the first epitaxial structure 10 into the first etched groove 14, and the orthographic projection of the second conductive contact portion 25 in the first etched groove 14 covers the orthographic projection of the bonding layer 30 in the first etched groove 14.

The orthographic projection of the second conductive contact portion 25 on the first epitaxial structure 10 is partially located at the edge of the bottom of the first etched groove 14. That is, the orthographic projection of the second conductive contact portion 25 and the orthographic projection of the first etched groove 14 partially overlap on the thickness direction Y of the micro-display unit. Thus, on the one hand, when the second via hole 60 is formed, the structure of the second via hole 60 including the step structure can be formed directly after the region corresponding to the second conductive contact portion 25 and the first etched groove 14 is patterned, so that the connection electrode can connect the light-emitting element formed by the first epitaxial structure 10 and the light-emitting element formed by the second epitaxial structure 20 in series; on the other hand, when the bonding layer 30 is etched, due to the blocking of the second conductive contact portion 25, the bonding layer 30 on the side wall of the first etched groove 14 blocked by the second conductive contact portion 25 is not etched away, and the bonding layer 30 on the side wall of the first etched groove 14 forms a bonding material protective layer 31, thereby protecting the side wall of the first etched groove 14 and preventing electric leakage caused by damage to the side wall during the subsequent etching process.

Figure 7:
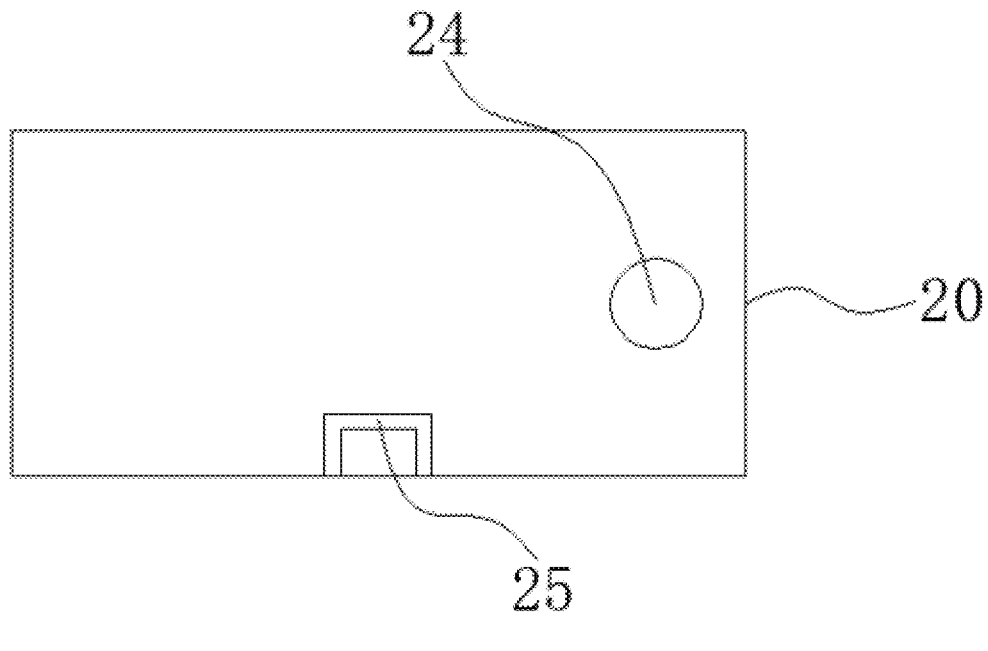
FIG. 7 is a top view of a second epitaxial structure.

FIG. 7 is a top view of a second epitaxial structure. Referring to FIG. 7, in one or more embodiments, the second conductive contact portion 25 is in the shape of a ring, for example, a non-closed ring shown in FIG. 7 or a closed ring. Correspondingly, the orthographic projection of the second conductive contact portion 25 in the first etched groove 14 is in the shape of a ring. With reference to FIG. 4 and FIG. 7, the annular orthographic projection of the second conductive contact portion 25 in the first etched groove 14 may be in the shape of a square ring, a circular ring, an elliptical ring, or another ring. This is not limited in this embodiment. The micro-display unit structure, in which orthographic projection of the second conductive contact portion 25 in the first etched groove 14 is in a shape of a ring, ensures that the bonding layer 30 at multiple side walls of the first etched groove 14 is not etched away. This micro-display unit structure further protects the side walls of the first etched groove 14 and prevents electric leakage caused by damage to the side walls during subsequent etching processes. It is to be noted that in this embodiment, the annular orthographic projection of the second conductive contact portion 25 in the first etched groove 14 may be a closed annular orthographic projection or a non-closed annular orthographic projection. The non-closed annular orthographic projection is an annular projection including an opening. FIG. 5 illustrates that the annular orthographic projection of the second conductive contact portion 25 in the first etched groove 14 may be a closed annular orthographic projection.

With continued reference to FIG. 2 to FIG. 3, in one or more embodiments, the first via hole 40 includes a second etched groove 24 and a second connection hole 42. The second etched groove 24 extends from the surface of the second epitaxial structure 20 facing the bonding layer 30 to the second semiconductor layer 2013 of the second epitaxial structure 20. The second connection hole 42 communicates with the second etched groove 24 and extends to the surface of the second epitaxial structure 20 facing away from the bonding layer 30. The second connection hole 42 is formed after the second etched groove 24.

The second etched groove 24 is formed before the first epitaxial structure 10 and the second epitaxial structure 20 are bonded. The second connection hole 42 is formed after the first epitaxial structure 10 and the second epitaxial structure 20 are bonded. In a micro-display unit structure in which the second epitaxial structure 20 includes the second current spreading layer 21, the second etched groove 24 extends from the second current spreading layer 21 to the second semiconductor layer 2013 of the second epitaxial structure 20. In a micro-display unit structure in which the second etched groove 24 does not include the second current spreading layer 21, the second etched groove 24 extends from the first semiconductor layer 2011 of the second epitaxial structure 20 to the second semiconductor layer 2013 of the second epitaxial structure 20. When the first epitaxial structure 10 and the second epitaxial structure 20 are bonded, the bonding material is filled into the second etched groove 24 so that the bonding material at the second etched groove 24 is thick. The thick bonding layer can form a buffer, being more conducive to precise control of etching and expanding the etching process window.

In some embodiments of the present disclosure, the orthographic projection of the first via hole 40 on the first epitaxial structure 10 is located within the orthographic projection of the first conductive contact portion 15 on the first epitaxial structure 10. In this manner, a reliable connection between the first electrode 34 and the first conductive contact portion 15 can be ensured.

In the case where the first via hole 40 includes the second etched groove 24 and the second connection hole 42, the orthographic projection of the second etched groove 24 on the first epitaxial structure 10 is located within the orthographic projection of the first conductive contact portion 15 on the first epitaxial structure 10. On the one hand, when the first epitaxial structure 10 and the second epitaxial structure 20 are aligned and bonded, the alignment accuracy requirement during bonding can be reduced. On the other hand, the first conductive contact portion 15 can more fully play the role of the etch stop layer, preventing the first epitaxial structure 10 outside the first conductive contact portion 15 from being etched due to an alignment deviation when the first via hole 40 is formed and ensuring the device performance of the micro-display unit.

In some embodiments of the present disclosure, the orthographic projection of the first via hole 40 on the first epitaxial structure 10 covers the orthographic projection of the first conductive contact portion 15 on the first epitaxial structure 10.

In the case where the first via hole 40 includes the second etched groove 24 and the second connection hole 42, the orthographic projection of the second etched groove 24 on the first epitaxial structure 10 covers the orthographic projection of the first conductive contact portion 15 on the first epitaxial structure 10. When the first epitaxial structure 10 and the second epitaxial structure 20 are aligned, it is necessary to ensure that the positions of the second etched groove 24 and the first conductive contact portion 15 correspond to each other. When the first via hole 40 is formed, the etching area of the bonding layer 30 in the second etched groove 24 is required to be less than the area of the first conductive contact portion 15 (here the etching area of the bonding layer 30 and the area of the first conductive contact portion 15 both refer to the area in the horizontal direction X). Thus, the damage to the epitaxial sidewall caused by etching can be avoided, and the first conductive contact portion 15 can more fully play the role of the etch stop layer.

Based on each previous embodiment, in one or more embodiments, the first conductive contact part 15 includes a stacked structure. The stacked structure includes multiple stacked metal layers. In this manner, on the one hand, the conductive effect of the first conductive contact portion 15 can be ensured; on the other hand, the first conductive contact portion 15 can play the role of reflecting light, thereby increasing the amount of light emitted from the micro-display unit.

In one or more embodiments, the first conductive contact portion 15 includes a first adhesive layer, a reflective layer, a second adhesive layer, an etch stop layer, and a third adhesive layer stacked in sequence on one side of the first epitaxial structure 10. The first adhesive layer, the second adhesive layer, and the third adhesive layer are each made of at least one of Ti or Ni. The reflective layer is made of at least one of Ag or Al. The etch stop layer is made of at least one of Pt or Cr.

The first adhesive layer, the second adhesive layer, and the third adhesive layer may be made of an adhesive metal, and the first adhesive layer, the second adhesive layer, and the third adhesive layer each include, but are not limited to, at least one of Ti or Ni. The reflective layer may be made of a metal with high reflectivity in the visible light spectrum. The reflective layer may be made of, but not limited to, at least one of Ag or Al. The etch stop layer may be made of, but not limited to, at least one of Pt or Cr.

The first adhesive layer can ensure a reliable connection between the first conductive contact portion 15 and the first epitaxial structure 10. The reflective layer can ensure the effect of the first conductive contact portion 15 reflecting light, thereby increasing the amount of light emitted from the micro-display unit. The second adhesive layer can ensure a greater bonding force between the metal layers inside the first conductive contact portion 15 and ensure the reliability of the structure of the first conductive contact portion 15. The etch stop layer can ensure that when the first via hole 40 is formed, the first conductive contact portion can better function as an etch stop and prevent over-etching of the first epitaxial structure 10 when the first via hole 40 is formed. The third adhesive layer can ensure a reliable connection between the first conductive contact portion 15 and the second epitaxial structure 20.

In one or more embodiments, the second conductive contact portion 25 and the first conductive contact portion 15 have the same stacked structure.

The second conductive contact portion 25 includes a first adhesive layer, a reflective layer, a second adhesive layer, an etch stop layer, and a third adhesive layer stacked in sequence on one side of the second epitaxial structure 20.

An embodiment of the present disclosure provides a manufacturing method of a micro-display unit. The method is configured to manufacture the micro-display unit of any previous embodiment of the present disclosure. FIG. 8 is a flowchart of a manufacturing method of a micro-display unit according to an embodiment of the present disclosure. Referring to FIG. 8, the manufacturing method of the micro-display unit includes S110 to S160.

In S110, a first epitaxial structure 10 and a second epitaxial structure 20 are provided.

Figure 9:
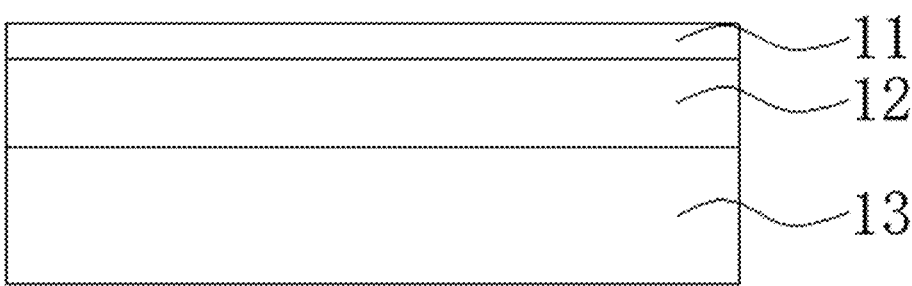
FIG. 9 is a view illustrating the structure of a first epitaxial structure.
Figure 10:
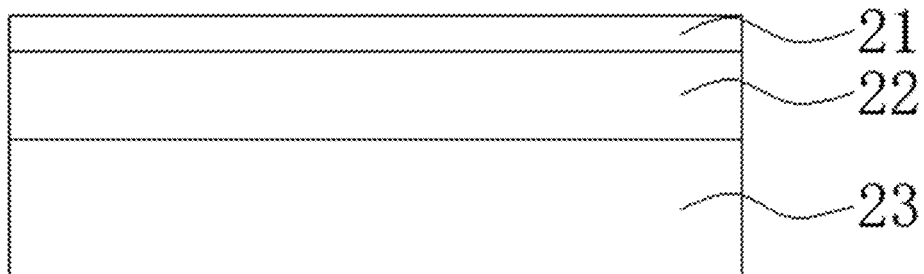
FIG. 10 is a view illustrating the structure of a second epitaxial structure.

FIG. 9 is a view illustrating the structure of a first epitaxial structure. Referring to FIG. 4 and FIG. 9, the first epitaxial structure 10 is located on one side of the first substrate 13, and the first epitaxial structure 10 includes a first epitaxial layer 12. FIG. 10 is a view illustrating the structure of a second epitaxial structure 20. Referring to FIGS. 5, 7 and 10, the second epitaxial structure 20 is located on one side of the second substrate 23, and the second epitaxial structure 20 includes a second epitaxial layer 22.

In S120, a first conductive contact portion is formed on one side of the first epitaxial structure 10.

Figure 11:
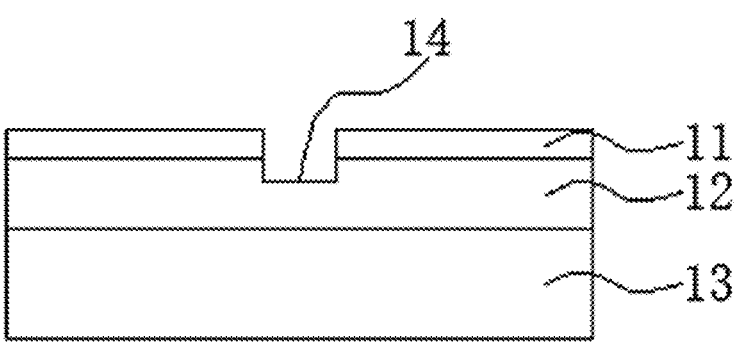
FIG. 11 is a view illustrating the structure of a first epitaxial structure provided with a first etched groove.
Figure 12:
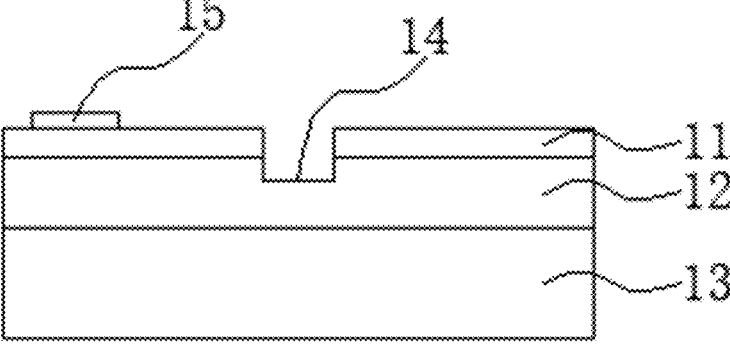
FIG. 12 is a view of a structure in which a first conductive contact portion is formed on one side of a first epitaxial structure.

In some embodiments of the present disclosure, before or after S120, the method also includes patterning the first epitaxial structure 10 to form a first etched groove. The first etched groove extends from the surface of the first epitaxial structure 10 facing the first semiconductor layer to the second semiconductor layer. FIG. 11 is a view illustrating the structure of a first epitaxial structure provided with a first etched groove. The first etched groove 14 extends from the surface of the first epitaxial structure 10 facing the first semiconductor layer to the second semiconductor layer. FIG. 12 is a view of a structure in which a first conductive contact portion is formed on one side of a first epitaxial structure 10. For a top view of a structure in which a first etched groove and a first conductive contact portion are formed on one side of the first epitaxial structure 10, see FIG. 4, where the first conductive contact portion 15 is electrically connected to the first semiconductor layer 1011 of the first epitaxial structure 10.

In S130, the first epitaxial structure 10 and the second epitaxial structure 20 are bonded through a bonding layer.

Figure 13:
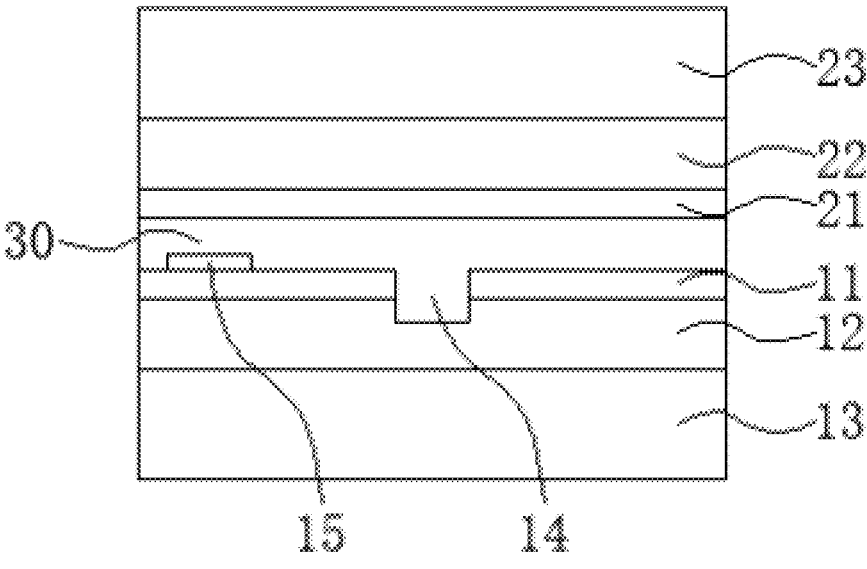
FIG. 13 is a view of a structure in which a first epitaxial structure and a second epitaxial structure are bonded through a bonding layer.
Figure 14:
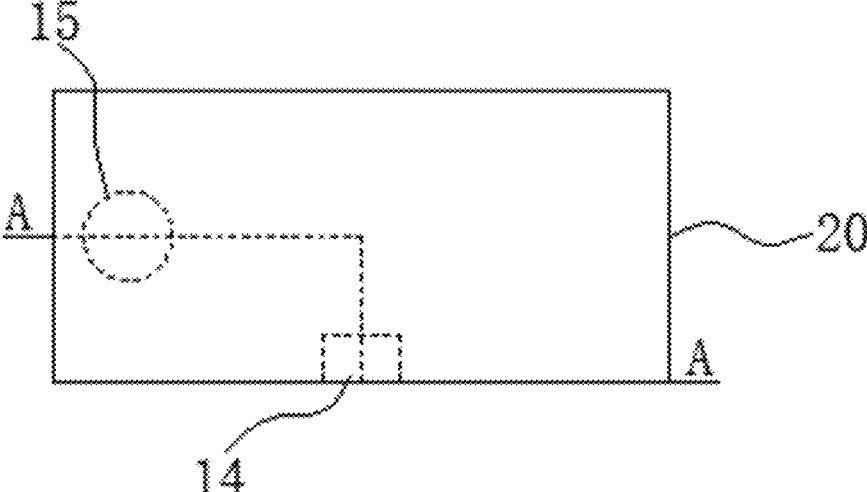
FIG. 14 is a top view of FIG. 13.
Figure 15:
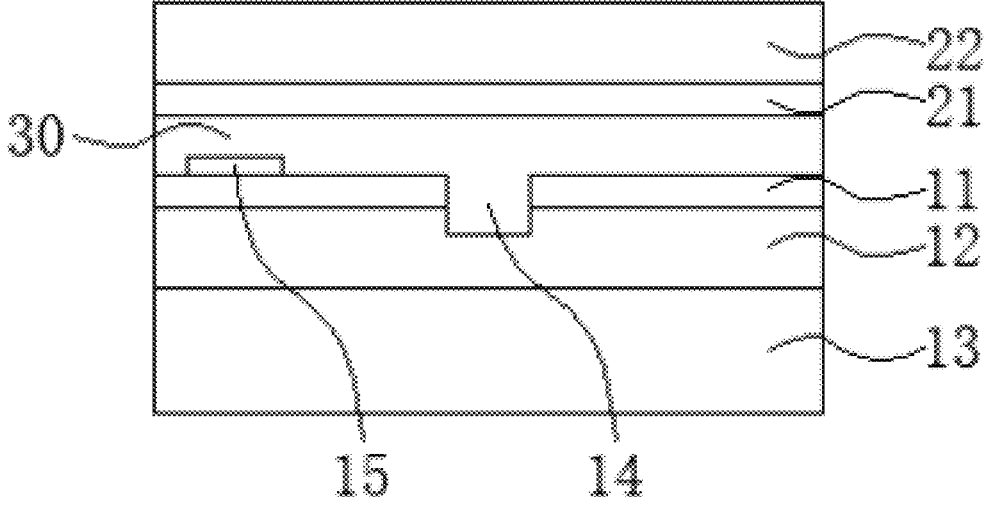
FIG. 15 is a view of a structure without a second substrate of a second epitaxial structure.

FIG. 13 is a view of a structure in which a first epitaxial structure and a second epitaxial structure are bonded through a bonding layer. FIG. 14 is a top view of FIG. 13. FIG. 13 may be obtained by cutting along AA of FIG. 14. The bonding layer 30 may bond and connect the first epitaxial structure 10 and the second epitaxial structure 20. The bonding material of the bonding layer 30 is an organic material that is easy to etch. The etching of the organic material of the bonding layer 30 may form a relatively large etching ratio with other structural materials. Other structures include the first epitaxial structure 10, the second epitaxial structure 20, and the first conductive contact part 15. Inductively Coupled Plasma Etching (ICP) is performed in an oxygen (O$_2$) environment. ICP enables 100-nanometers-per-minute etching on organic materials. ICP almost does no damage to other semiconductor materials. The organic material of the bonding layer 30 may be, for example, epoxy resin, polyimide, SU8, spin-on glass (SOG), benzocyclobutene (BCB), polymethyl methacrylate (PMMA), or parylene. The bonding layer 30 may be formed on the surface of the first epitaxial structure 10 and the surface of the second epitaxial structure 20 by spin coating or evaporation and chemical mechanical polishing. Then the first epitaxial structure 10 and the second epitaxial structure 20 on which the bonding layer 30 is formed may be bonded. Before S130, in the case where the first etched groove 14 is formed on the first epitaxial structure 10, when the first epitaxial structure 10 and the second epitaxial structure 20 are bonded, the bonding material of the bonding layer 30 is filled in the accommodation space of the first etched groove 14, increasing the thickness of the bonding layer 30 at the position of the first etched groove 14, facilitating accurate control of etching of the bonding layer 30 at the position of the first etched groove 14, and expanding the etching process window. After the first epitaxial structure 10 and the second epitaxial structure 20 are bonded, the second substrate of the second epitaxial structure 20 is removed. FIG. 15 is a view of a structure without a second substrate of a second epitaxial structure 20.

In S140, the second epitaxial structure 20 and the bonding layer on one side of the first conductive contact portion are patterned to form a first via hole, where the first via hole exposes the first conductive contact portion.

Figure 16:
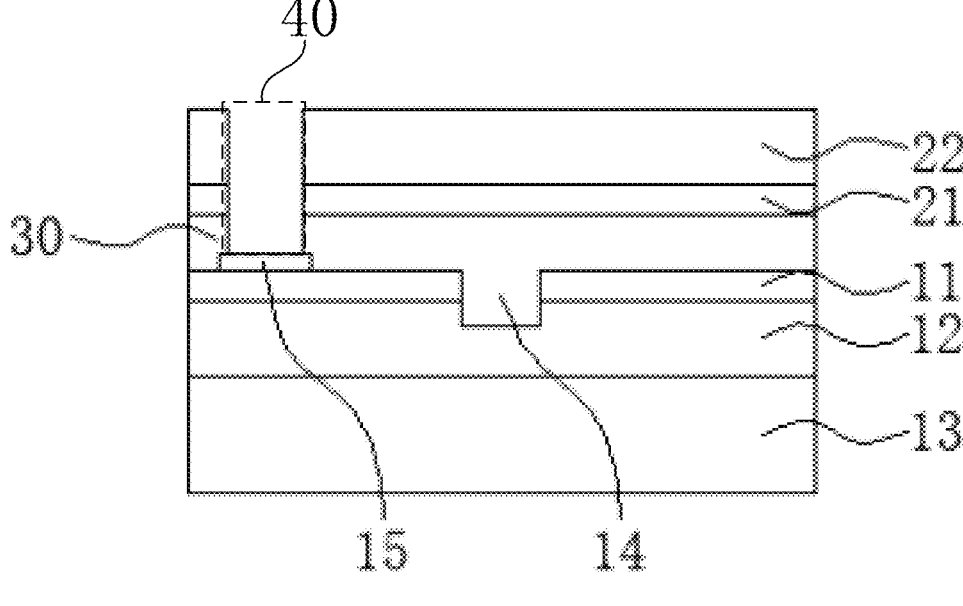
FIG. 16 is a view of a structure provided with a first via hole.

FIG. 16 is a view of a structure provided with a first via hole. The first via hole 40 may be formed by using photolithography and etching processes. The first via hole 40 penetrates the second epitaxial structure 20 and the bonding layer 30.

In S150, the second epitaxial structure 20 and the bonding layer are patterned to form a second via hole, where the second via hole exposes a second semiconductor layer 1013 of the first epitaxial structure 10.

The second via hole may be formed by using photolithography and etching processes. The second via hole exposes the second semiconductor layer 1013 of the first epitaxial structure 10. In one or more embodiments, the second via hole also exposes the first semiconductor layer 2011 of the second epitaxial structure 20 or a connection structure electrically connected to the first semiconductor layer 2011 of the second epitaxial structure 20. In some embodiments, the connection structure may be a second conductive contact portion disposed on one side of the first semiconductor layer 2011 of the second epitaxial structure 20. In other embodiments, the connection structure may be a second current spreading layer disposed on one side of the first semiconductor layer 2011 of the second epitaxial structure 20.

Figure 17:
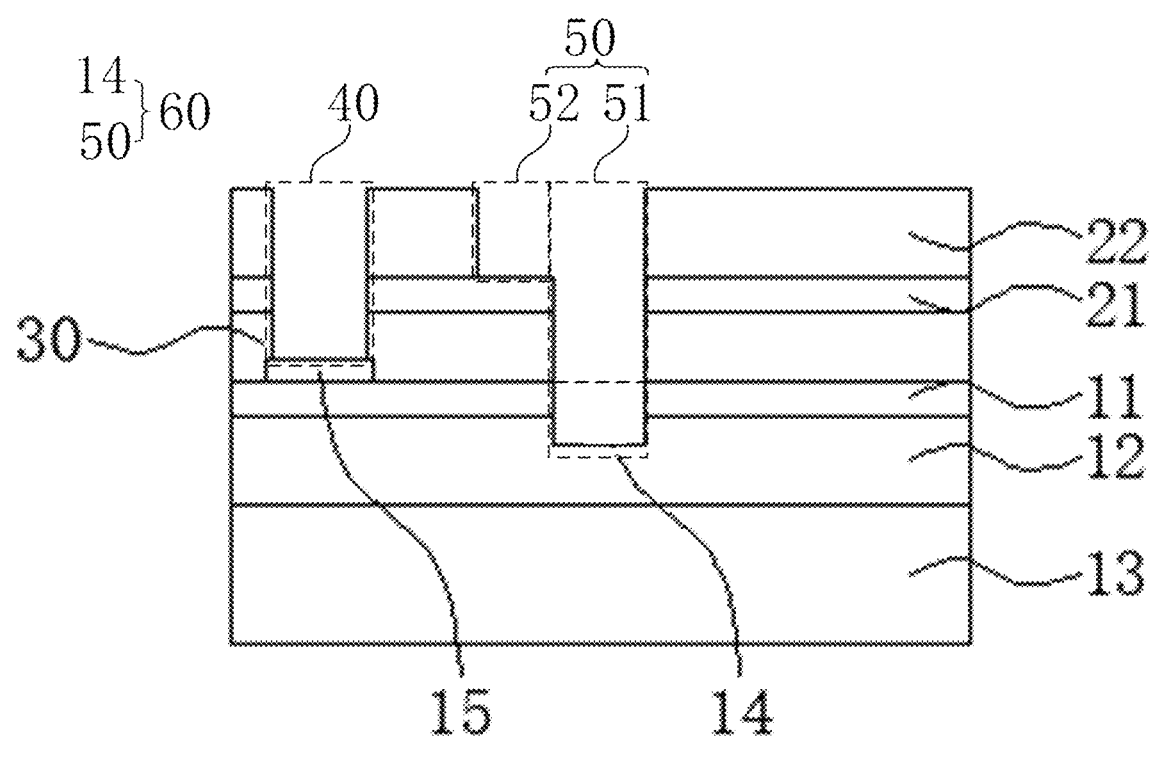
FIG. 17 is a view of a structure provided with a second via hole.

FIG. 17 is a view of a structure provided with a second via hole. In one or more embodiments, S150 includes patterning the second epitaxial structure 20 in the set region and patterning the bonding layer 30 on one side of the first etched groove 14 to form the second via hole 60. The second via hole 60 exposes the second semiconductor layer 1013 of the first epitaxial structure 10. The orthographic projection of the set region on the first epitaxial structure 10 covers the first etched groove 14. The set region includes a first region whose orthographic projection is within the first etched groove 14 and a second region whose orthographic projection is outside the first etched groove 14. At the position corresponding to the first region, the second via hole 60 includes a first hole portion 51. The first hole portion 51 communicates with the first etched groove 14. At the position corresponding to the second region, the second via hole 60 includes a second hole portion 52. The second hole portion 52 penetrates the epitaxial layer (the second epitaxial layer 22) of the second epitaxial structure 20. That is, the second hole portion 52 penetrates the second semiconductor layer 2013, the light-emitting layer 2012, and the first semiconductor layer 2011 of the second epitaxial structure 20. The bottom surface of the second hole portion 52 forms a mesa. The connection electrode 33 is connected to the first semiconductor layer 2011 of the second epitaxial structure 20 at the mesa.

The second via hole 60 formed by patterning the second epitaxial structure 20 in the set region and patterning the bonding layer 30 on one side of the first etched groove 14 includes the first hole portion 51, the second hole portion 52, and the first etched groove 14. The first hole portion 51 and the second hole portion 52 form the first connection hole 50. The bottom surface of the second hole portion 52 forms the mesa. Thus, when the connection electrode 33 is subsequently formed, the connection electrode 33 can be connected to the first semiconductor layer 2011 of the second epitaxial structure 20 at the mesa and connected to the second semiconductor layer 1013 of the first epitaxial structure 10 at the bottom of the first etched groove 14.

In S160, a first electrode is formed in the first via hole; a connection electrode is formed in the second via hole, where the connection electrode connects a first semiconductor layer 2011 of the second epitaxial structure 20 and the second semiconductor layer 1013 of the first epitaxial structure 10; and a second electrode connected to a second semiconductor layer 2013 of the second epitaxial structure 20 is formed.

Figure 18:
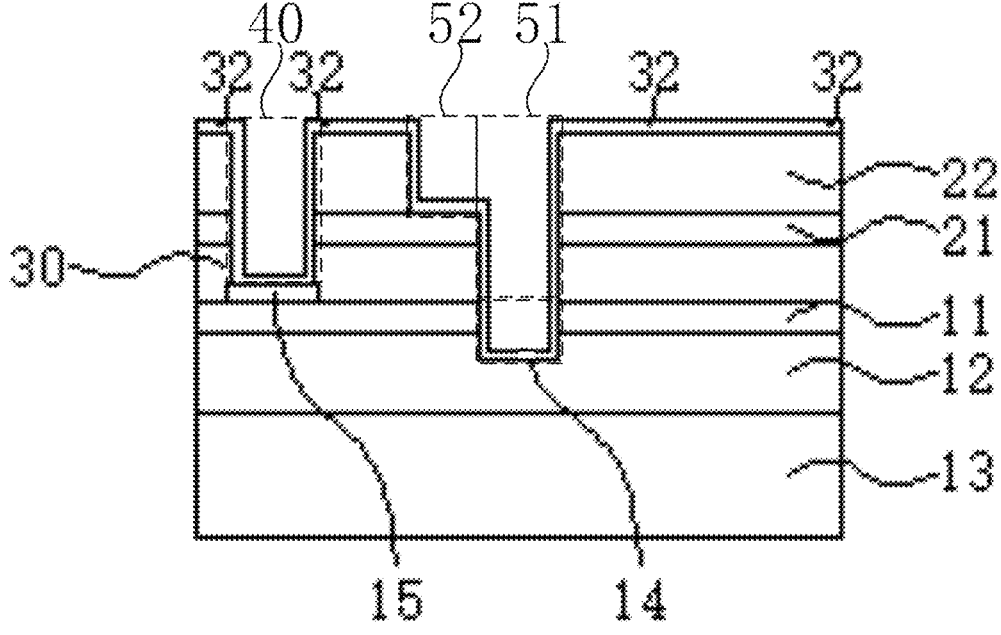
FIG. 18 is a view of a structure provided with an evaporated dielectric layer.
Figure 19:
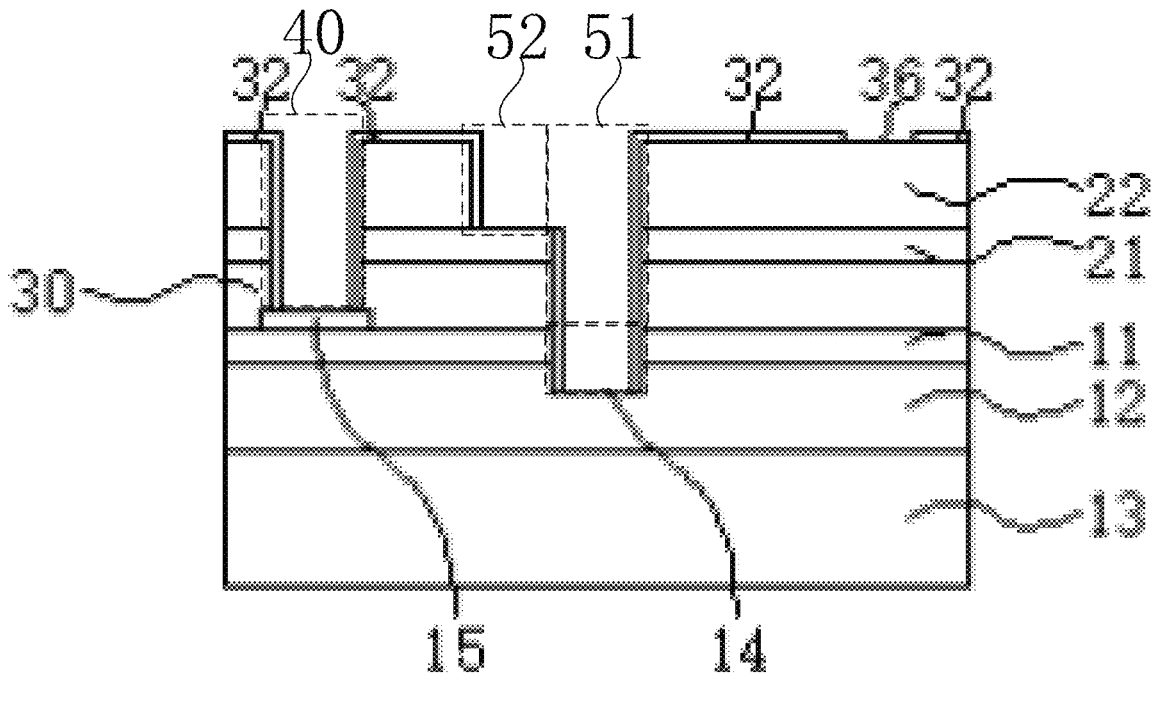
FIG. 19 is a view of a structure provided with an opening area.

Before the first electrode, the second electrode, and the connection electrode are formed, a dielectric layer is evaporated for sidewall passivation and insulation protection. FIG. 18 is a view of a structure provided with an evaporated dielectric layer. After the second via hole 60 is formed, a dielectric layer 32 is evaporated for sidewall passivation and insulation protection. Common dielectric layer evaporation methods include plasma enhanced chemical vapor deposition evaporation of silicon dioxide SiO$_2$ or silicon nitride SiN$_x$ and ALD ion enhanced atomic layer deposition evaporation of aluminum oxide Al$_2$O$_3$. Then photolithography and etching are used to leave an opening area in the dielectric layer 32. FIG. 19 is a view of a structure provided with an opening area. Referring to FIG. 19, there are three opening areas that correspond to the bottom position of the first via hole 40 (the side of the first conductive contact portion 15 facing away from the first epitaxial layer 11), the mesa position of the second via hole 60 and the bottom position of the first etched groove 14, and the third via hole 36 respectively. Then a metal electrode is evaporated to obtain the micro-display unit shown in FIG. 2, in which the first electrode 34 is formed in the first via hole 40, the connection electrode 33 is formed in the second via hole 60, and the second electrode 35 is formed in the third via hole. The connection electrode 33 connects the first semiconductor layer 2011 of the second epitaxial structure 20 and the second semiconductor layer 1013 of the first epitaxial structure 10 so that the light-emitting element formed by the first epitaxial structure 10 and the light-emitting element formed by the second epitaxial structure 20 are connected in series, thereby increasing the current density and the luminous efficiency.

In the manufacturing method of the micro-display unit of this embodiment of the present disclosure, in the manufacturing process of the micro-display unit, in the process of forming the first via hole by patterning, the first conductive contact portion can serve as an etch stop layer, reducing the risk of over-etching the first epitaxial structure 10 when the first via hole is formed. When the first epitaxial structure 10 and the second epitaxial structure 20 are aligned and bonded, the first epitaxial structure 10 and the second epitaxial structure 20 are directly bonded through the bonding layer, then the first via hole is formed at the position corresponding to the first conductive contact portion, and the second via hole corresponding to the connection electrode is formed in the second epitaxial structure 20, thereby reducing the requirements for the bonding process.

Referring to FIG. 9, in one or more embodiments, the first epitaxial structure 10 also includes a first current spreading layer 11. The first current spreading layer 11 is located on the side of the first semiconductor layer facing away from the second semiconductor layer in the first epitaxial structure 10. Referring to FIG. 10, in one or more embodiments, the second epitaxial structure 20 also includes a second current spreading layer 21. The second current spreading layer 21 is located on the side of the first semiconductor layer facing away from the second semiconductor layer in the second epitaxial structure 20.

Figure 20:
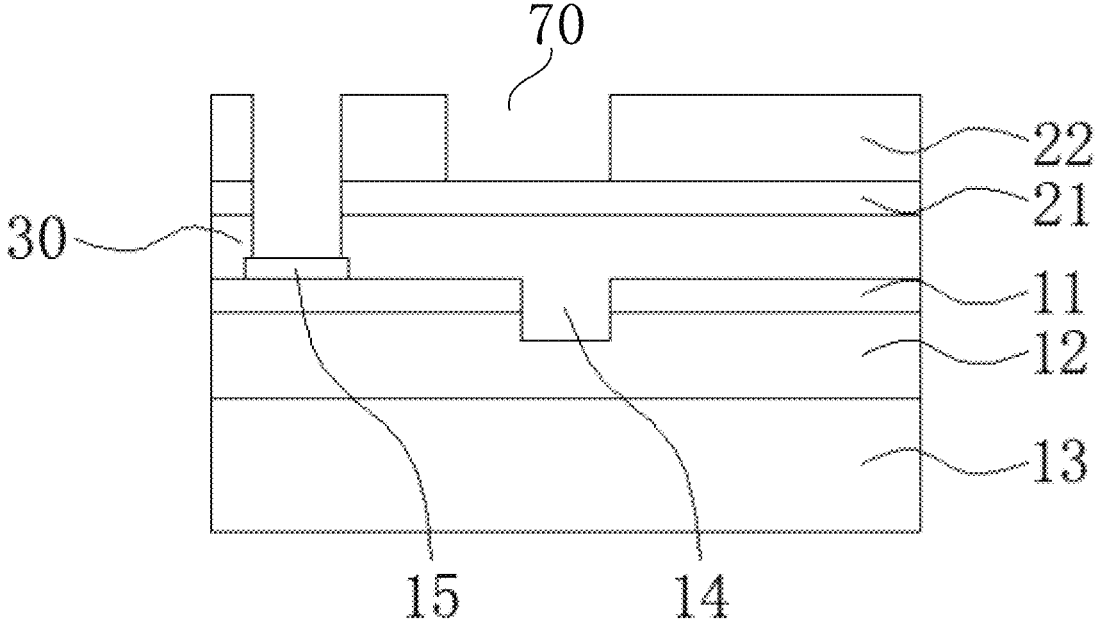
FIG. 20 is a view of a structure provided with a first groove.

In some embodiments, S160 includes patterning the second epitaxial structure 20 in the set region to form a first groove. The first groove penetrates the epitaxial layer (the second epitaxial layer) of the second epitaxial structure 20. The orthographic projection of the first groove on the first epitaxial structure 10 covers the first etched groove 14. FIG. 20 is a view of a structure provided with a first groove. Referring to FIG. 20, when the first epitaxial structure 10 in the structure shown in FIG. 16 is etched, the etching stays at the second current spreading layer 21, that is, the first groove 70 exposes the second current spreading layer 21, to obtain the structure shown in FIG. 20. With reference to FIG. 20 and FIG. 17, the second current spreading layer 21 and the bonding layer 30 on one side of the first etched groove 14 are then patterned to form the second via hole 60, that is, the structure of the second via hole 60 shown in FIG. 17. Along the thickness direction Y of the micro-display unit, the portion of the first groove 70 corresponding to the first etched groove 14 communicates with the first etched groove 14 to form the first hole portion 51; and the portion of the first groove 70 not corresponding to the first etched groove 14 forms the second hole portion 52. In this embodiment, the second via hole 60 is formed in two steps, with the bonding layer in the first etched groove 14 as an etching buffer, thereby facilitating accurate etching of the bonding layer 30. In addition, when the first epitaxial structure 10 and the second epitaxial structure 20 are bonded, the first epitaxial structure 10 and the second epitaxial structure 20 are not required to be accurately aligned, thereby simplifying the bonding process and improving the bonding yield.

In one or more embodiments, before S130, the method also includes forming a second etched groove 24 in the second epitaxial structure 20 and forming a second conductive contact portion 25 on one side of the second epitaxial structure 20. The second conductive contact portion 25 is connected to the first semiconductor layer 2011 of the second epitaxial structure 20. The second etched groove 24 extends from the surface of the second epitaxial structure 20 facing the first semiconductor layer to the second semiconductor layer.

Figure 21:
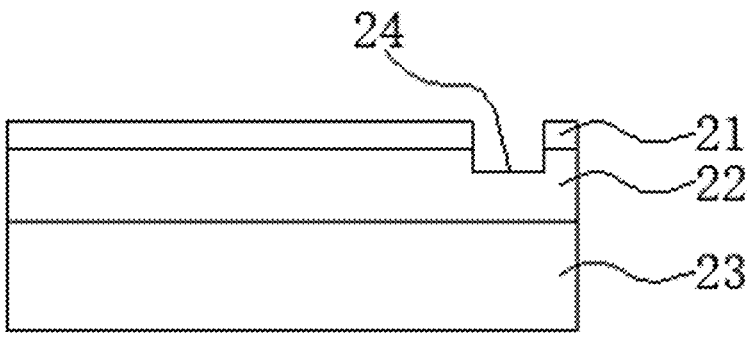
FIG. 21 is a view illustrating the structure of a second epitaxial structure provided with a second etched groove.
Figure 22:
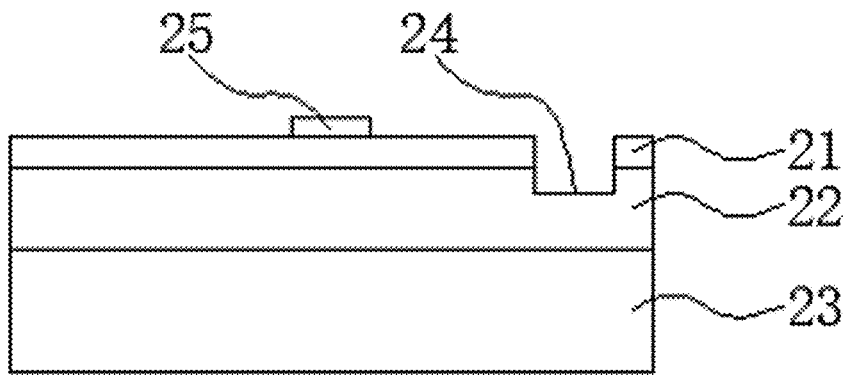
FIG. 22 is a view illustrating the structure of a second epitaxial structure provided with a second etched groove and a second conductive contact portion.
Figure 23:
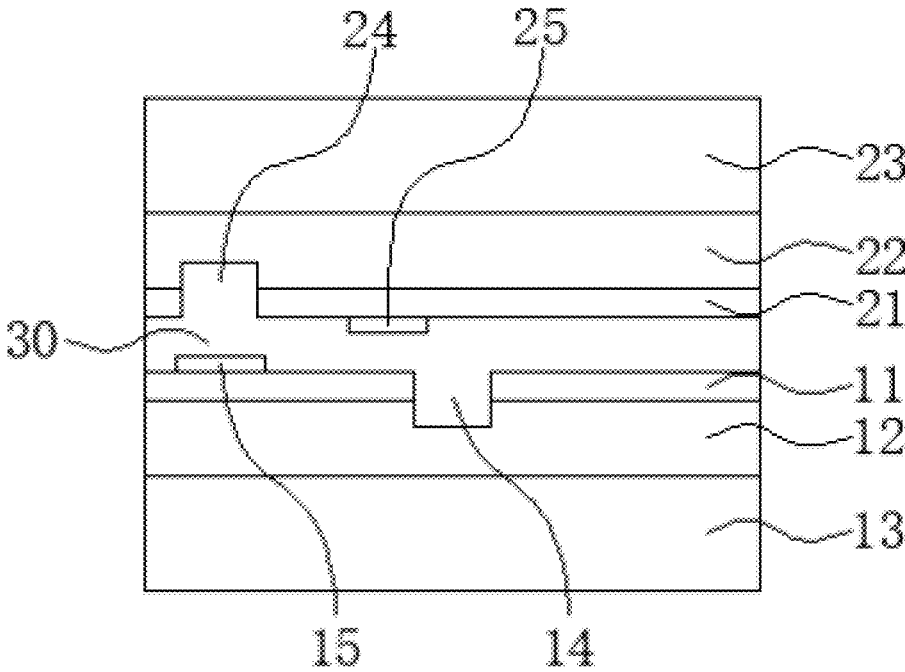
FIG. 23 is a view of a structure in which a first epitaxial structure and a second epitaxial structure are bonded.
Figure 24:
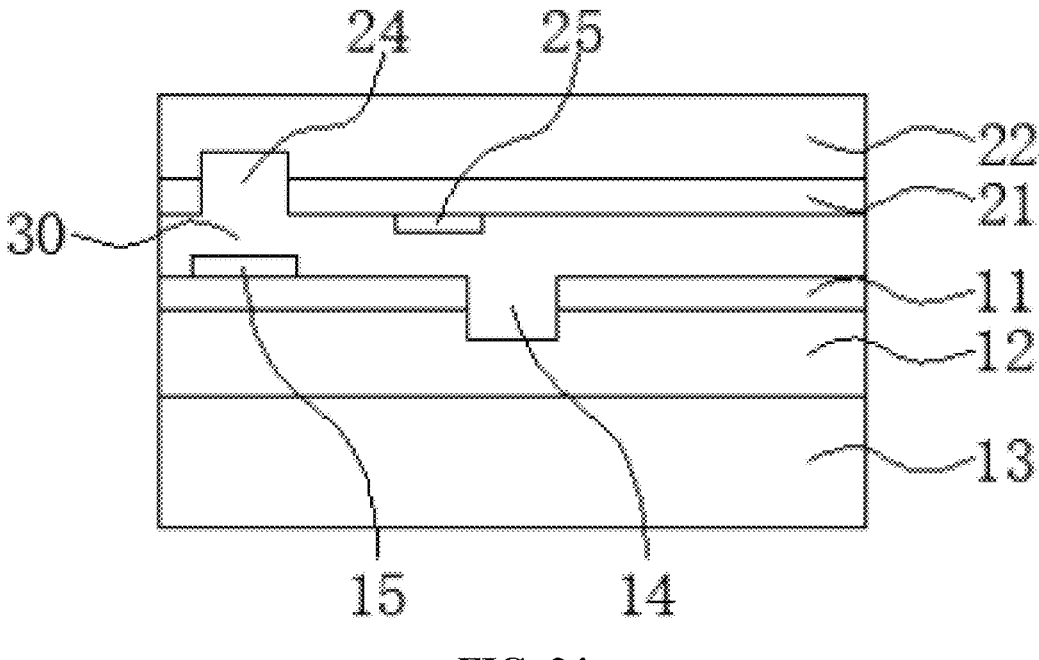
FIG. 24 is a view of a structure without a second substrate of a second epitaxial structure.

FIG. 21 is a view illustrating the structure of a second epitaxial structure 20 provided with a second etched groove. FIG. 22 is a view illustrating the structure of a second epitaxial structure 20 provided with a second etched groove and a second conductive contact portion. For a top view of the second epitaxial structure 20 provided with the second etched groove and the second conductive contact portion, see FIG. 5 or FIG. 7. Before the first epitaxial structure 10 and the second epitaxial structure 20 are bonded, the second etched groove 24 is formed in the second epitaxial structure 20. Thus, when the first epitaxial structure 10 and the second epitaxial structure 20 are bonded, the bonding material of the bonding layer 30 can be filled in the accommodation space of the second etched groove 24, increasing the thickness of the bonding layer 30 at the position of the second etched groove 24 and facilitating accurate control of etching. When the first epitaxial structure 10 and the second epitaxial structure 20 are bonded, the position of the second etched groove 24 of the second epitaxial structure 20 may be aligned with the first conductive contact portion 15, and the position of the second conductive contact portion 25 of the second epitaxial structure 20 may be aligned with the position of the first etched groove 14 of the first epitaxial structure 10. This ensures that the second conductive contact portion 25 overlaps the second etched groove 24. Here the overlapping area of the second conductive contact portion 25 and the second etched groove 24 accounts for 10% to 30% of the total area of the second conductive contact portion 25, and/or the overlapping area of the second conductive contact portion 25 and the second etched groove 24 accounts for 10% to 30% of the total area of the second etched groove 24. FIG. 23 is a view of a structure in which a first epitaxial structure and a second epitaxial structure are bonded. The top view corresponding to FIG. 23 is shown in FIG. 6. FIG. 23 can be obtained by cutting along BB of FIG. 6. After the first epitaxial structure 10 and the second epitaxial structure 20 are bonded, the second substrate of the second epitaxial structure 20 is removed. FIG. 24 is a view of a structure without a second substrate of a second epitaxial structure 20.

In one or more embodiments, S140 includes thinning and/or patterning the second epitaxial structure 20 on the side of the second semiconductor layer to expose the bonding layer; and etching the bonding layer by using a set etching gas to form the first via hole and expose the first conductive contact portion. Here, in a set etching gas environment, the etching rate of the bonding layer 30 is greater than the etching rate of the first epitaxial structure 10 and the second epitaxial structure 20.

Figure 25:
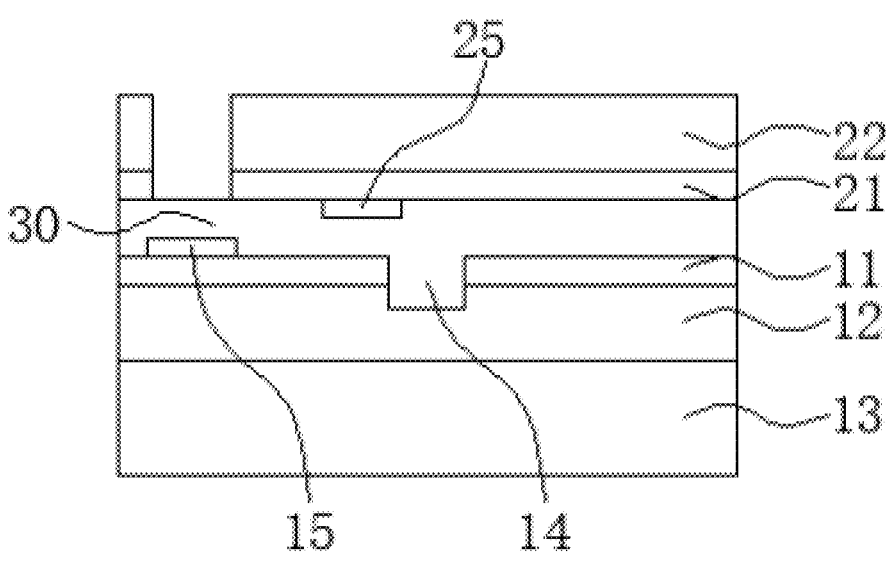
FIG. 25 is a view of a structure in which a second epitaxial structure is thinned and/or patterned on one side of a second semiconductor layer to expose a bonding layer.
Figure 26:
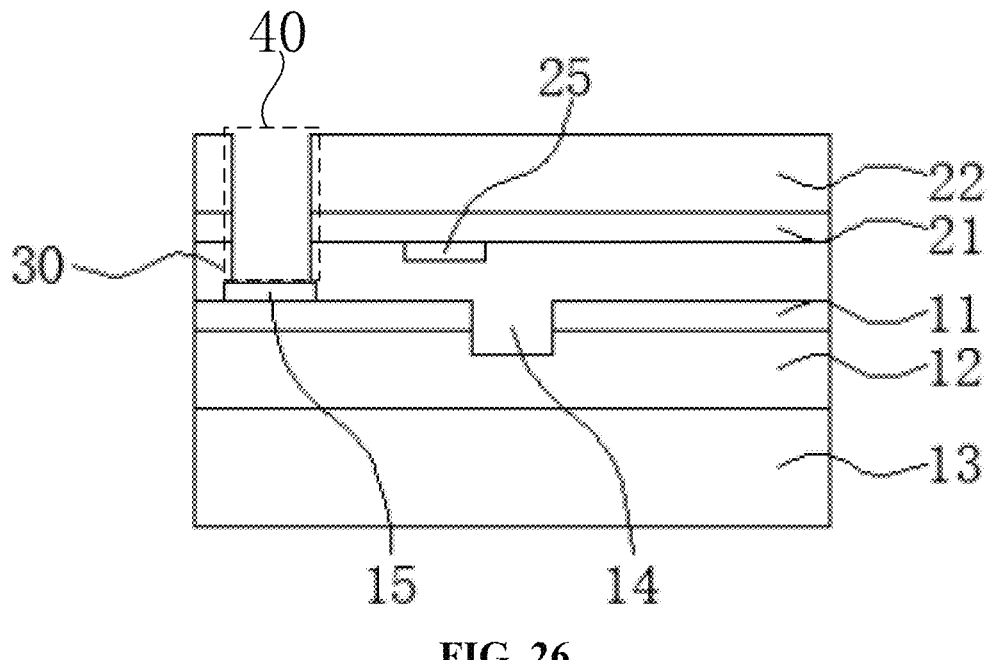
FIG. 26 is a view of a structure provided with a first via hole.

FIG. 25 is a view of a structure in which a second epitaxial structure is thinned and/or patterned on one side of a second semiconductor layer to expose a bonding layer. In this embodiment, the first via hole 40 is formed in two steps. In the case where the second epitaxial structure 20 on the side of the second semiconductor layer is thinned, the second epitaxial structure 20 may be thinned to the position of the second etched groove 24 (where the second semiconductor layer 2013 of the second epitaxial structure 20 may remain 200 nm to 400 nm), thereby exposing the bonding layer 30 in the second etched groove 24. In this case, the second etched groove 24 may serve as the first via hole 40. In the case where the second epitaxial structure 20 on the side of the second semiconductor layer is patterned, the second epitaxial structure 20 on the side of the second etched groove 24 may be etched to form the second connection hole 42 (referring to FIG. 3) from the surface of the second epitaxial structure 20 facing away from the bonding layer 30 to the second etched groove 24, thereby exposing the bonding layer 30 in the second etched groove 24. In this case, the first via hole 40 includes the second connection hole 42 and the second etched groove 24. FIG. 26 is a view of a structure provided with a first via hole.

Then the bonding layer 30 in the second etched groove 24 is etched with a set etching gas to form a complete first via hole 40. The set etching gas may be oxygen. In a set etching gas environment, the etching rate of the bonding layer 30 is greater than the etching rate of other structures. For example, in an oxygen environment, the etching rate of the bonding layer 30 is greater than 80 nm/min. This almost does no etching damage to the first epitaxial structure 10, the second epitaxial structure 20, the first conductive contact portion 15, the second conductive contact portion 25, the first current spreading layer 11, and the second current spreading layer 21, thereby ensuring the device performance of the formed micro-display unit.

Figure 27:
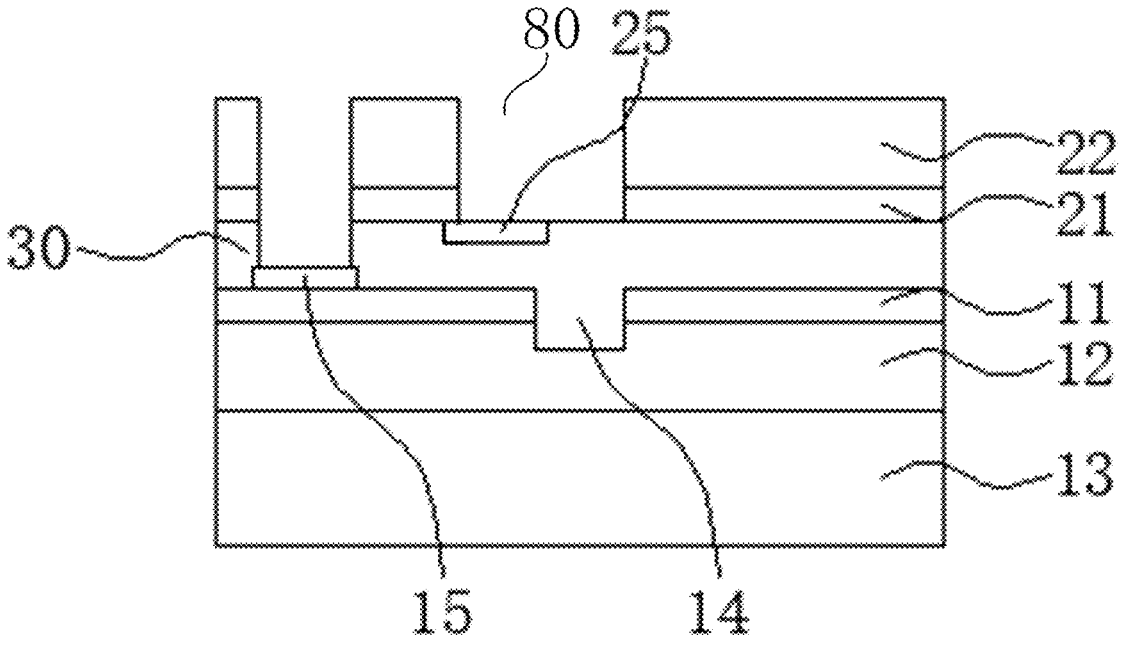
FIG. 27 is a view of a structure provided with a second groove.

In one or more embodiments, S160 includes patterning the second epitaxial structure 20 in the set region to the second conductive contact portion by using a first etching process to form a second groove. FIG. 27 is a view of a structure provided with a second groove. The second groove 80 penetrates the second epitaxial structure 20. The second groove penetrates the second semiconductor layer 2013, the light-emitting layer 2012, and the first semiconductor layer 2011 of the second epitaxial structure 20. In the case where the second epitaxial structure 20 includes the second current spreading layer 21, the second groove penetrates the second current spreading layer 21 of the second epitaxial structure 20. Here the second region in the set region corresponds to the position of the second conductive contact portion 25, and the projection of the second region on the second conductive contact portion 25 is located within the second conductive contact portion 25. Thus, part of the second current spreading layer and/or the first semiconductor layer 2011 of the second epitaxial structure 20 can be retained on the side of the second conductive contact portion 25 facing away from the bonding layer. In the first etching process, an etching rate of the second conductive contact portion 25 is less than 10% of the etching rate of the second epitaxial structure 20, and the etching rate of the bonding layer 30 is less than the etching rate of the second epitaxial structure 20. The bonding layer 30 at the first etched groove 14 is etched by using a second etching process to form the second via hole 60. Along the thickness direction of the micro-display unit, the portion of the second groove 80 corresponding to the first etched groove 14 communicates with the first etched groove 14 to form the first hole portion 51; and the portion of the second groove 80 not corresponding to the first etched groove 14 forms the second hole portion 52. In the set etching gas environment corresponding to the second etching process, the etching rate of the bonding layer 30 is greater than the etching rate of the first epitaxial structure 10 and the second epitaxial structure 20.

Figure 28:
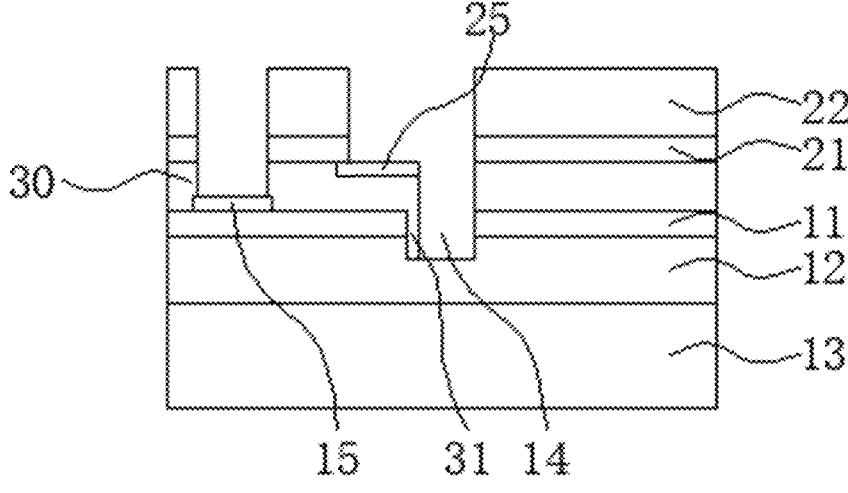
FIG. 28 is a view of a structure provided with a second via hole.

The orthographic projection of the second groove on the first epitaxial structure 10 covers the orthographic projection of the first etched groove 14 on the first epitaxial structure 10. In this embodiment, the second via hole 60 is formed in two etching steps. In the first etching process, the second groove is formed, and the second conductive contact portion 25 serves as the etch stop layer. Since the bonding layer 30 is filled in the second etched groove 24, and the bonding layer 30 in the second etched groove 24 serves as an etching buffer, the bonding layer 30 can receive a certain degree of over-etching, thereby avoiding over-etching the first epitaxial structure 10 and ensuring the device performance of the micro-display unit. FIG. 28 is a view of a structure provided with a second via hole. Referring to FIG. 28, in the second etching process, the etching rate of the bonding layer 30 is greater than the etching rate of the first epitaxial structure 10 and the second epitaxial structure 20 so that the bonding layer 30 in the second etched groove 24 is accurately etched, thereby better avoiding over-etching the first epitaxial structure 10 and better ensuring the performance of the device.

Figure 29:
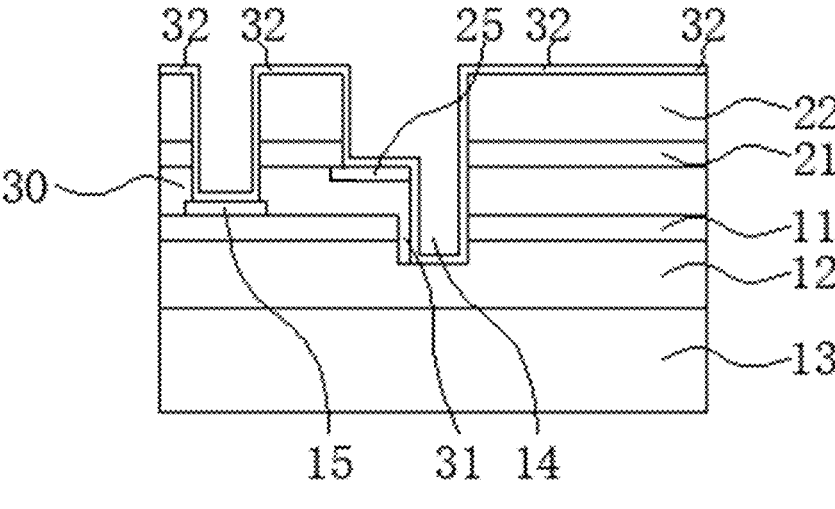
FIG. 29 is a view of a structure provided with an evaporated dielectric layer.

After the second via hole 60 is formed, a dielectric layer is evaporated for sidewall passivation and insulation protection. FIG. 29 is a view of a structure provided with an evaporated dielectric layer. Then photolithography and etching are used to leave an opening area in the dielectric layer 32. FIG. 30 is a view of a structure provided with an opening area. There are three opening areas that correspond to the bottom position of the first via hole 40 (the side of the first conductive contact portion 15 facing away from the first epitaxial layer 11), the mesa position of the second via hole 60 and the bottom position of the first etched groove 14, and the third via hole 36 respectively. Then a metal electrode is evaporated to obtain the micro-display unit shown in FIG. 3, in which the first electrode 34 is formed in the first via hole 40, an intermediate electrode is formed in the second via hole 60, and the second electrode 35 is formed in the third via hole 36.

It is to be understood that various forms of the preceding flows may be used with steps reordered, added, or deleted. For example, the steps described in the present disclosure may be performed in parallel, in sequence, or in a different order as long as the desired result of the technical solutions provided in the present disclosure can be achieved. The execution sequence of these steps is not limited herein.

The scope of the present disclosure is not limited to the preceding embodiments. It is to be understood by those skilled in the art that various modifications, combinations, subcombinations, and substitutions may be made according to design requirements and other factors. Any modification, equivalent substitution, or improvement made within the spirit and principle of the present disclosure fall within the scope of the present disclosure.

The invention claimed is:

1. A micro-display unit, comprising: a first epitaxial structure, a second epitaxial structure, and a bonding layer, wherein the first epitaxial structure and the second epitaxial structure are stacked along a thickness direction of the micro-display unit, and the bonding layer is located between the first epitaxial structure and the second epitaxial structure;

the first epitaxial structure and the second epitaxial structure each comprise an epitaxial layer, and the epitaxial layer comprises a first semiconductor layer, a light-emitting layer, and a second semiconductor layer that are stacked; and in each of the first epitaxial structure and the second epitaxial structure, the first semiconductor layer is located on a side of the second semiconductor layer facing the bonding layer;

the micro-display unit further comprises a first conductive contact portion, the first conductive contact portion is located on a side of the first epitaxial structure facing the bonding layer, and the second epitaxial structure is provided with a first via hole at a position corresponding to the first conductive contact portion;

the micro-display unit further comprises a first electrode, a connection electrode, and a second electrode, the first electrode passes through the first via hole and is electrically connected to the first conductive contact portion so that the first electrode is electrically connected to the first semiconductor layer of the first epitaxial structure, and the second electrode is electrically connected to the second semiconductor layer of the second epitaxial structure; and the second epitaxial structure is further provided with a second via hole, the second via hole penetrates the second epitaxial structure and extends to the second semiconductor layer of the first epitaxial structure, the connection electrode passes through the second via hole and is electrically connected to the second semiconductor layer of the first epitaxial structure, and the connection electrode is further electrically connected to the first semiconductor layer of the second epitaxial structure.

2. The micro-display unit of claim 1, wherein the second via hole comprises a first etched groove and a first connection hole, the first etched groove extends from a surface of the first epitaxial structure facing the bonding layer to the second semiconductor layer of the first epitaxial structure, the first connection hole is located on a side of the first etched groove facing away from the first epitaxial structure, and the first connection hole penetrates the second epitaxial structure and the bonding layer and communicates with the first etched groove.

3. The micro-display unit of claim 2, wherein the first connection hole comprises a first hole portion and a second hole portion, the second hole portion is located on at least one side of the first hole portion in a horizontal direction, and the horizontal direction is perpendicular to the thickness direction of the micro-display unit; and the first hole portion penetrates the second epitaxial structure and the bonding layer and communicates with the first etched groove, the second hole portion penetrates the epitaxial layer of the second epitaxial structure, a bottom surface of the second hole portion and a side surface of the first hole portion are connected to form a step structure, the bottom surface of the second hole portion serves as a mesa of the step structure, the connection electrode is electrically connected to the first semiconductor layer of the second epitaxial structure at the mesa, and the connection electrode is electrically connected to the second semiconductor layer of the first epitaxial structure at a bottom of the first etched groove.

4. The micro-display unit of claim 3, wherein the first epitaxial structure further comprises a first current spreading layer located between the first semiconductor layer of the first epitaxial structure and the bonding layer, and the second epitaxial structure further comprises a second current spreading layer located between the first semiconductor layer of the second epitaxial structure and the bonding layer.

5. The micro-display unit of claim 4, wherein the second hole portion extends to the second current spreading layer, and the mesa is formed at a position that is located on a surface of the second current spreading layer facing away from the bonding layer and corresponds to the second hole portion.

6. The micro-display unit of claim 3, further comprising a second conductive contact portion, wherein the second conductive contact portion is located on a side of the second epitaxial structure facing the bonding layer, the mesa is formed at a position that is located on a surface of the second conductive contact portion facing away from the bonding layer and corresponds to the second via hole, and the second conductive contact portion is connected to the first semiconductor layer of the second epitaxial structure and the connection electrode.

7. The micro-display unit of claim 6, wherein an orthographic projection of the second conductive contact portion on the first epitaxial structure is partially located at an edge of the bottom of the first etched groove, the bonding layer extends from a side of the second conductive contact portion facing the first epitaxial structure into the first etched groove, and an orthographic projection of the second conductive contact portion in the first etched groove covers an orthographic projection of the bonding layer in the first etched groove.

8. The micro-display unit of claim 7, wherein the orthographic projection of the second conductive contact portion in the first etched groove is in a shape of a ring.

9. The micro-display unit of claim 1, wherein the first via hole comprises a second etched groove and a second connection hole, the second etched groove extends from a surface of the second epitaxial structure facing the bonding layer to the second semiconductor layer of the second epitaxial structure, the second connection hole communicates with the second etched groove and extends to a surface of the second epitaxial structure facing away from the bonding layer, and the second connection hole is formed after the second etched groove.

10. The micro-display unit of claim 1, wherein an orthographic projection of the first via hole on the first epitaxial structure is located within an orthographic projection of the first conductive contact portion on the first epitaxial structure.

11. The micro-display unit of claim 9, wherein an orthographic projection of the first via hole on the first epitaxial structure is located within an orthographic projection of the first conductive contact portion on the first epitaxial structure.

12. The micro-display unit of claim 1, wherein an orthographic projection of the first via hole on the first epitaxial structure covers an orthographic projection of the first conductive contact portion on the first epitaxial structure.

13. The micro-display unit of claim 9, wherein an orthographic projection of the first via hole on the first epitaxial structure covers an orthographic projection of the first conductive contact portion on the first epitaxial structure.

14. The micro-display unit of claim 1, wherein the first conductive contact portion comprises a stacked structure, and the stacked structure comprises a plurality of stacked metal layers.

15. The micro-display unit of claim 14, wherein the first conductive contact portion comprises a first adhesive layer, a reflective layer, a second adhesive layer, an etch stop layer, and a third adhesive layer stacked in sequence on one side of the first epitaxial structure; and the first adhesive layer, the second adhesive layer, and the third adhesive layer are each made of at least one of Ti or Ni, the reflective layer is made of at least one of Ag or Al, and the etch stop layer is made of at least one of Pt or Cr.

16. The micro-display unit of claim 6, wherein the second conductive contact portion and the first conductive contact portion have a same stacked structure.

17. A display panel, comprising: a micro-display unit;

wherein the micro-display unit comprises a first epitaxial structure, a second epitaxial structure, and a bonding layer, wherein the first epitaxial structure and the second epitaxial structure are stacked along a thickness direction of the micro-display unit, and the bonding layer is located between the first epitaxial structure and the second epitaxial structure;

the first epitaxial structure and the second epitaxial structure each comprise an epitaxial layer, and the epitaxial layer comprises a first semiconductor layer, a light-emitting layer, and a second semiconductor layer that are stacked; and in each of the first epitaxial structure and the second epitaxial structure, the first semiconductor layer is located on a side of the second semiconductor layer facing the bonding layer;

the micro-display unit further comprises a first conductive contact portion, the first conductive contact portion is located on a side of the first epitaxial structure facing the bonding layer, and the second epitaxial structure is provided with a first via hole at a position corresponding to the first conductive contact portion;

the micro-display unit further comprises a first electrode, a connection electrode, and a second electrode, the first electrode passes through the first via hole and is electrically connected to the first conductive contact portion so that the first electrode is electrically connected to the first semiconductor layer of the first epitaxial structure, and the second electrode is electrically connected to the second semiconductor layer of the second epitaxial structure; and the second epitaxial structure is further provided with a second via hole, the second via hole penetrates the second epitaxial structure and extends to the second semiconductor layer of the first epitaxial structure, the connection electrode passes through the second via hole and is electrically connected to the second semiconductor layer of the first epitaxial structure, and the connection electrode is further electrically connected to the first semiconductor layer of the second epitaxial structure.

18. The display panel of claim 17, wherein the second via hole comprises a first etched groove and a first connection hole, the first etched groove extends from a surface of the first epitaxial structure facing the bonding layer to the second semiconductor layer of the first epitaxial structure, the first connection hole is located on a side of the first etched groove facing away from the first epitaxial structure, and the first connection hole penetrates the second epitaxial structure and the bonding layer and communicates with the first etched groove.

19. The display panel of claim 18, wherein the first connection hole comprises a first hole portion and a second hole portion, the second hole portion is located on at least one side of the first hole portion in a horizontal direction, and the horizontal direction is perpendicular to the thickness direction of the micro-display unit; and the first hole portion penetrates the second epitaxial structure and the bonding layer and communicates with the first etched groove, the second hole portion penetrates the epitaxial layer of the second epitaxial structure, a bottom surface of the second hole portion and a side surface of the first hole portion are connected to form a step structure, the bottom surface of the second hole portion serves as a mesa of the step structure, the connection electrode is electrically connected to the first semiconductor layer of the second epitaxial structure at the mesa, and the connection electrode is electrically connected to the second semiconductor layer of the first epitaxial structure at a bottom of the first etched groove.

20. The display panel of claim 19, wherein the first epitaxial structure further comprises a first current spreading layer located between the first semiconductor layer of the first epitaxial structure and the bonding layer, and the second epitaxial structure further comprises a second current spreading layer located between the first semiconductor layer of the second epitaxial structure and the bonding layer.

* * * * *